(12) United States Patent
Middlehurst et al.

(10) Patent No.: US 6,238,225 B1
(45) Date of Patent: May 29, 2001

(54) BUS BAR ASSEMBLY

(75) Inventors: Richard J. Middlehurst; Donald E. Wood, both of Fremont; Robert S. Jetter, Oakland, all of CA (US)

(73) Assignee: TVM Group, Inc., Fremont, CA (US)

( * ) Notice: Subject to any disclaimer, the term of this patent is extended or adjusted under 35 U.S.C. 154(b) by 0 days.

(21) Appl. No.: 09/405,517

(22) Filed: Sep. 23, 1999

Related U.S. Application Data
(60) Provisional application No. 60/101,478, filed on Sep. 23, 1998.

(51) Int. Cl.[7] ............................. H01R 9/22; H01R 11/09; H01R 4/60
(52) U.S. Cl. ..................... 439/212; 439/721; 439/723; 439/709
(58) Field of Search ................................ 439/212, 723, 439/721, 709

(56) References Cited

U.S. PATENT DOCUMENTS

| | | | |
|---|---|---|---|
| 4,749,357 | 6/1988 | Foley | 439/80 |
| 4,758,172 * | 7/1988 | Richards et al. | 439/212 |
| 4,854,899 | 8/1989 | Matthews | 439/724 |
| 4,886,468 * | 12/1989 | Harton et al. | 439/212 |
| 5,442,135 * | 8/1995 | Faulkner et al. | 174/68.2 |

* cited by examiner

*Primary Examiner*—Paula Bradley
*Assistant Examiner*—Edwin A. León
(74) *Attorney, Agent, or Firm*—Flehr Hohbach Test Albritton & Herbert LLP

(57) ABSTRACT

A bus bar assembly that includes a plurality of bus bars having substantially planar portions disposed in juxtaposition. Adjacent bus bars are electrically isolated from each other. The portion of each of the bus bars is made from an electrically conductive material and has a region provided with at least one interconnect hole extending through the bus bar and adapted to cooperatively receive a pin member. The regions of the bus bars are disposed substantially in a plane so as to permit pin members of equal lengths to be utilized for making electrical connections with the bus bars.

18 Claims, 30 Drawing Sheets

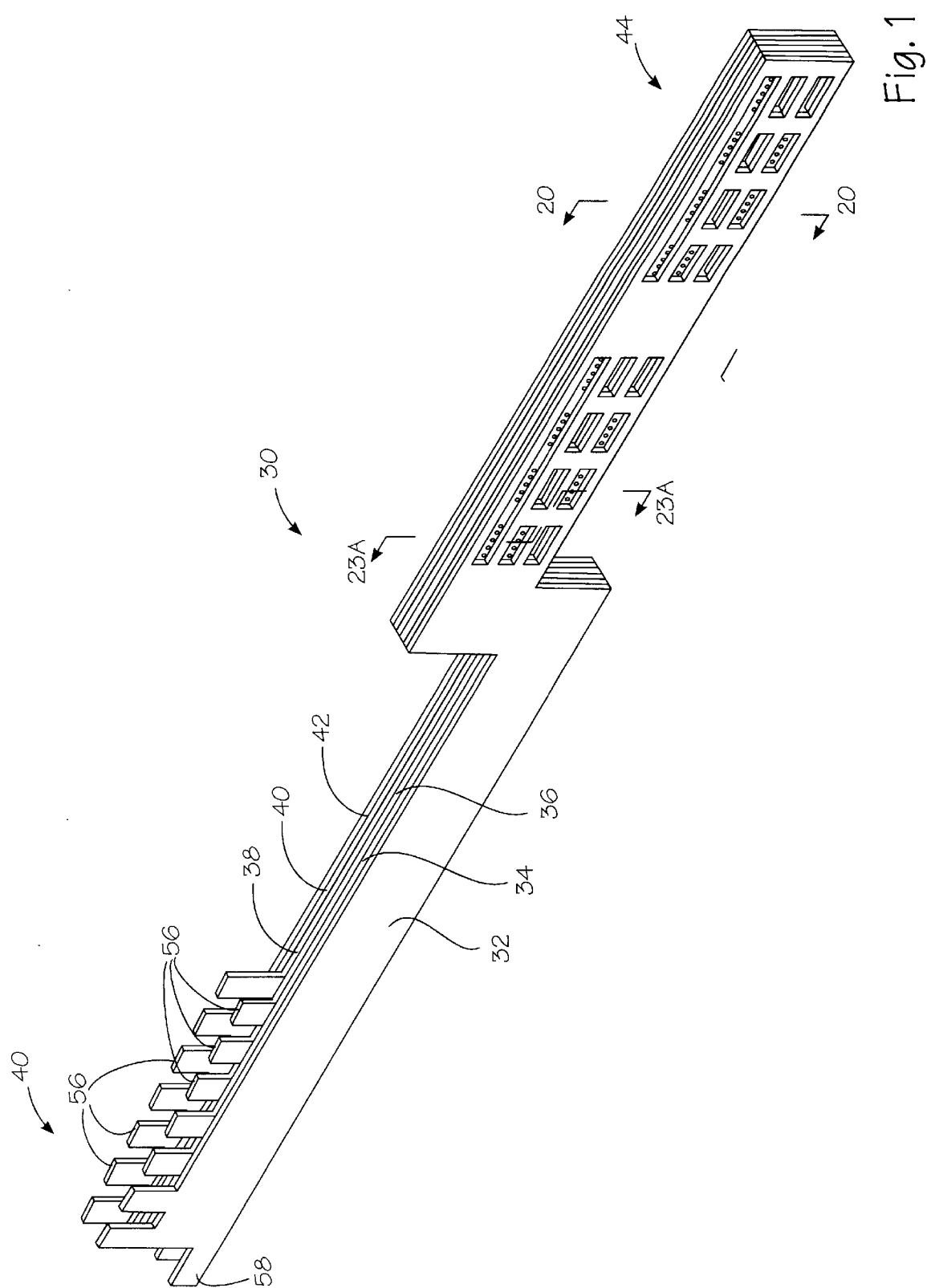

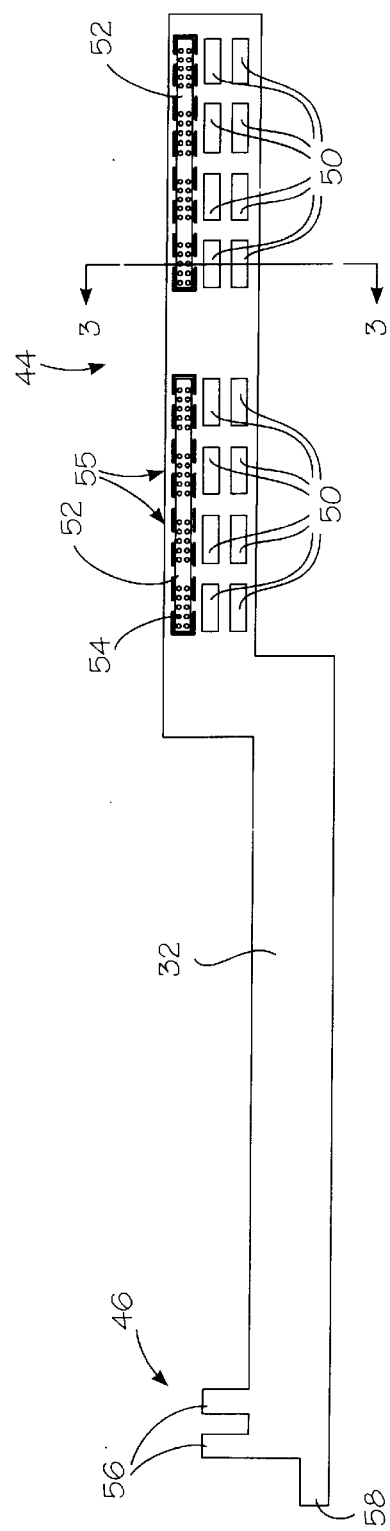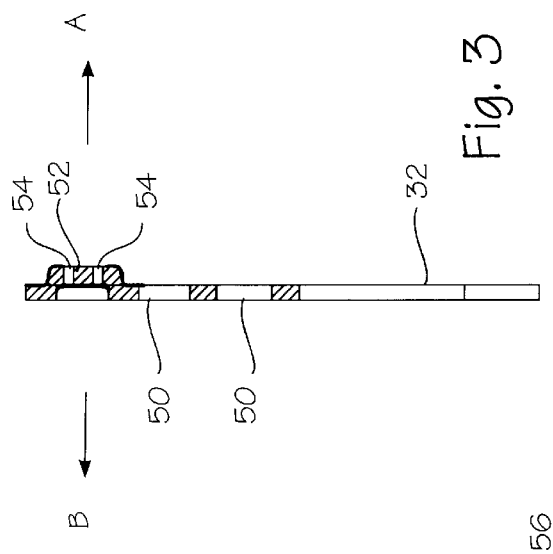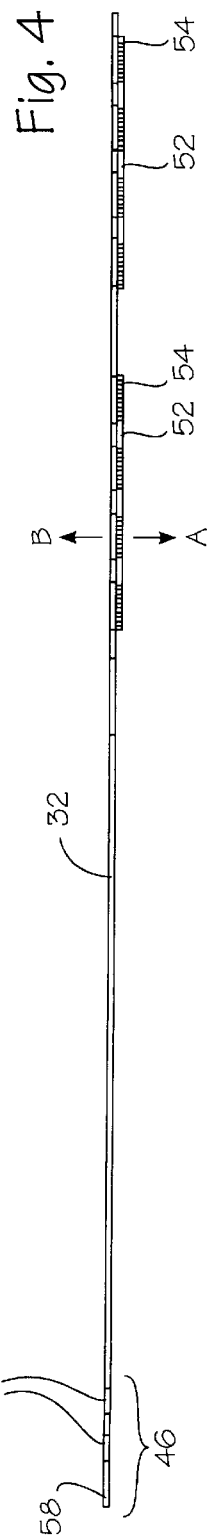

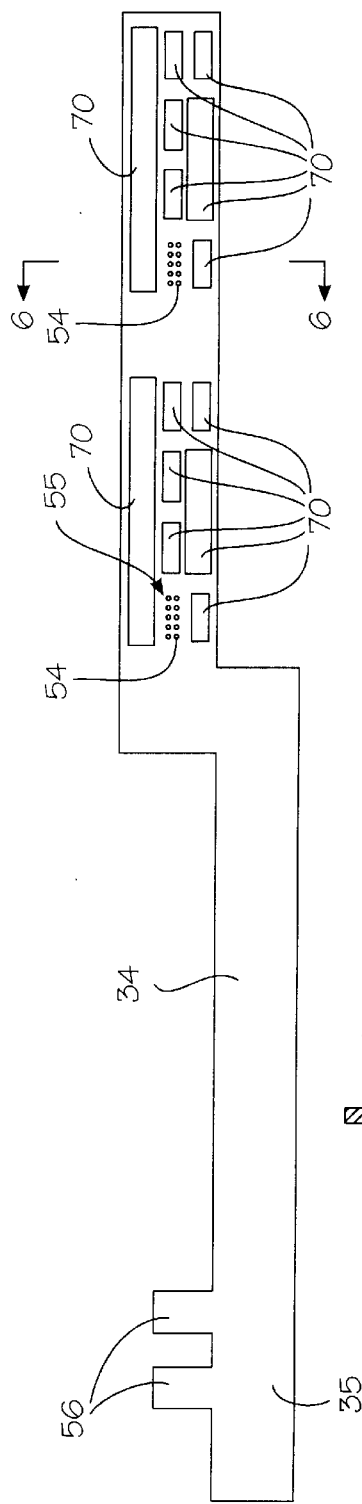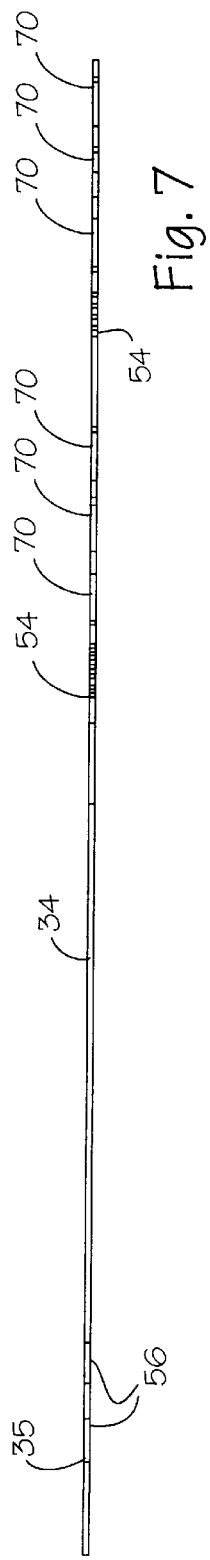

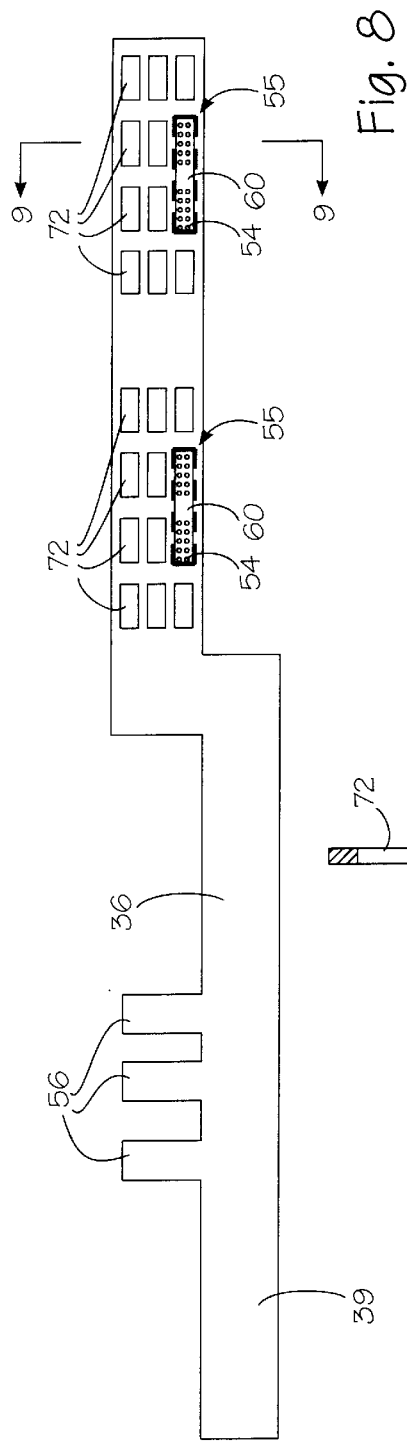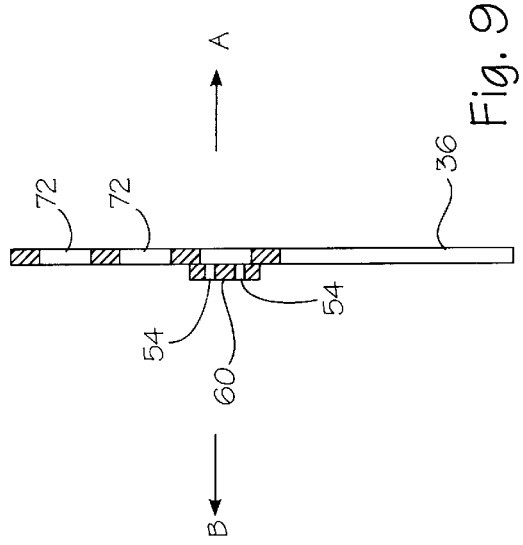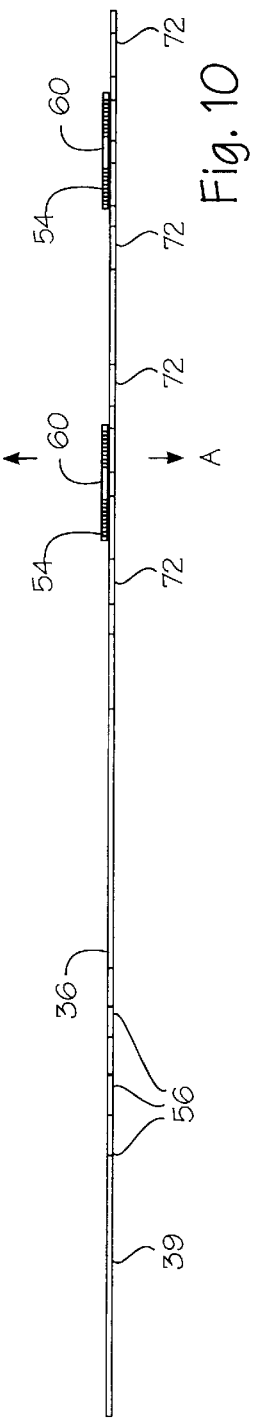

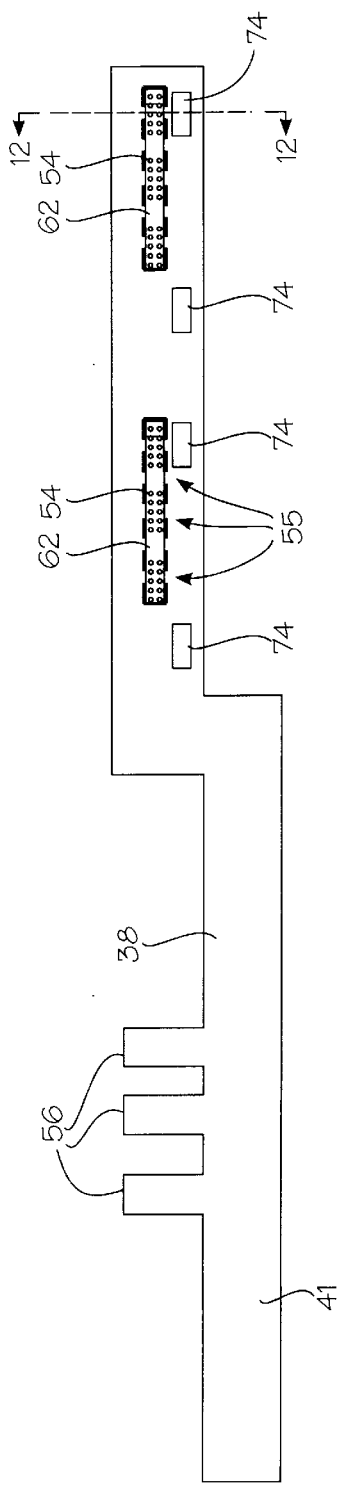
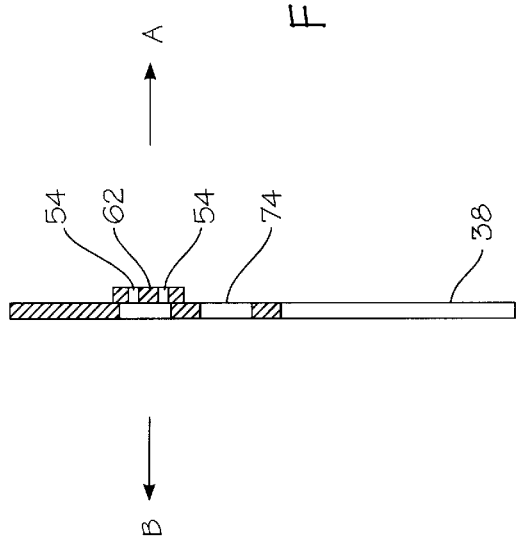
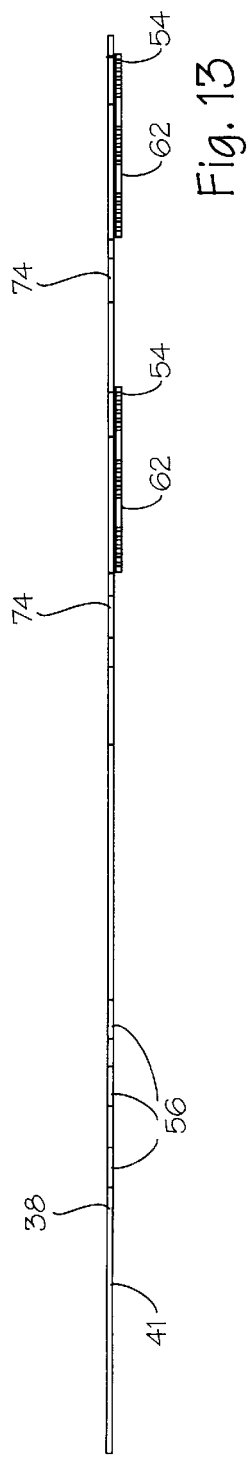

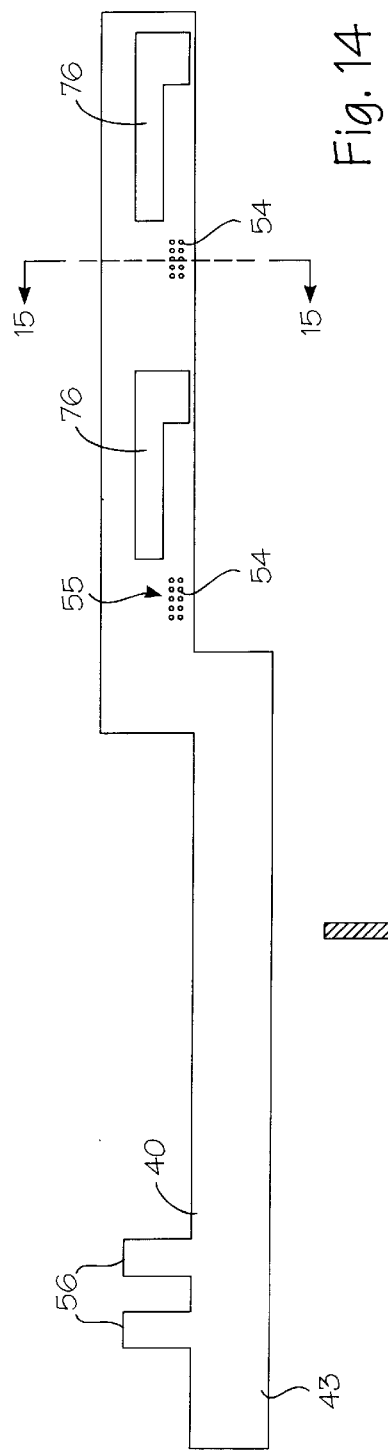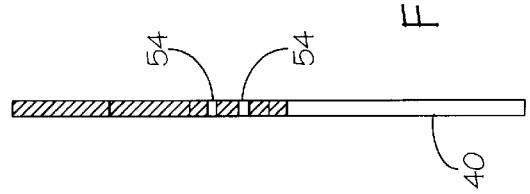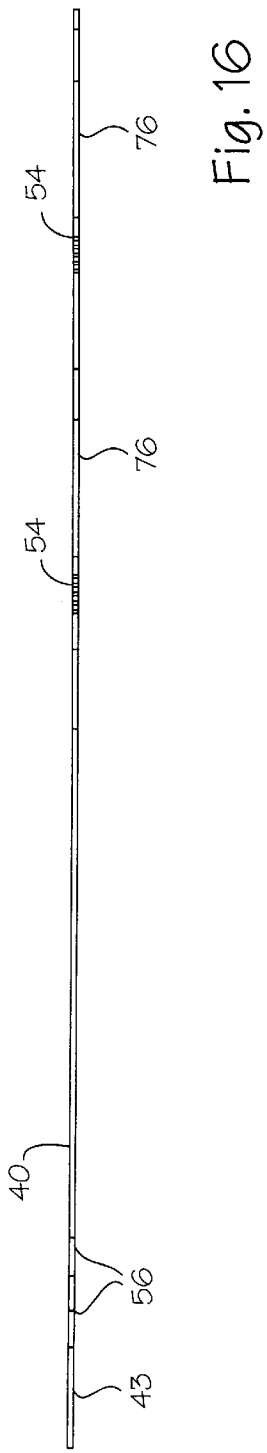

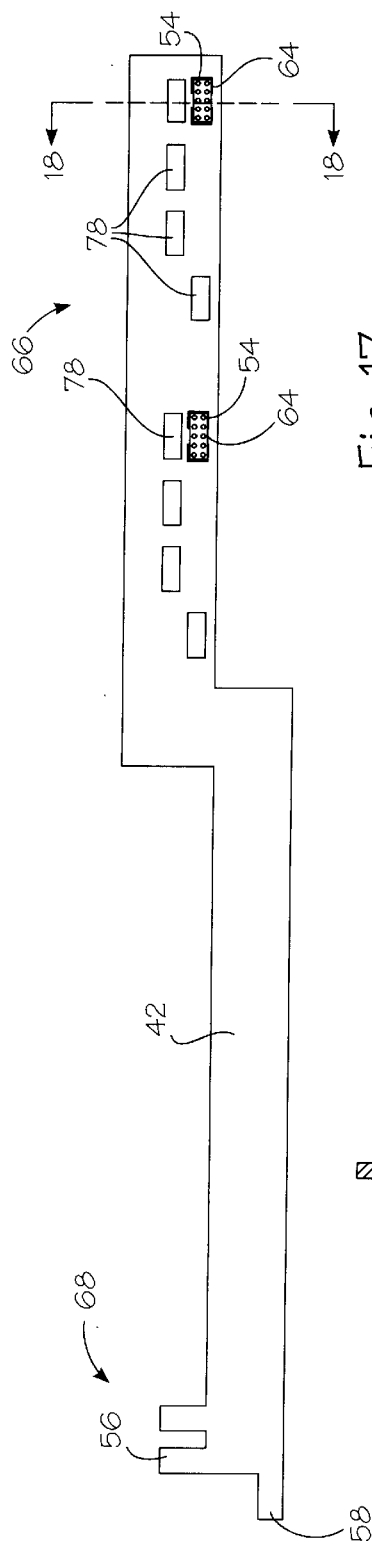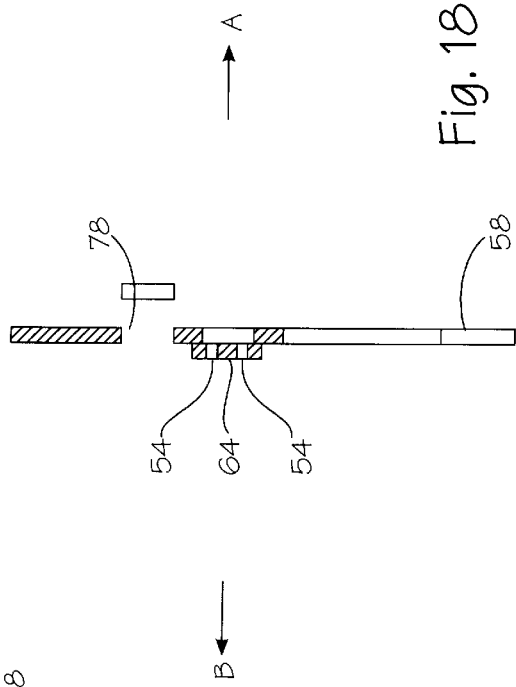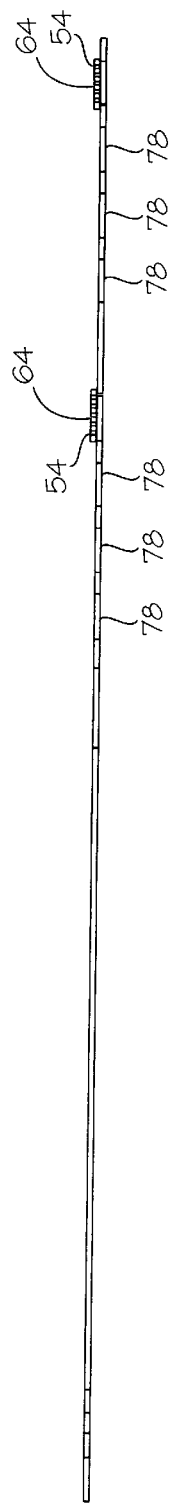

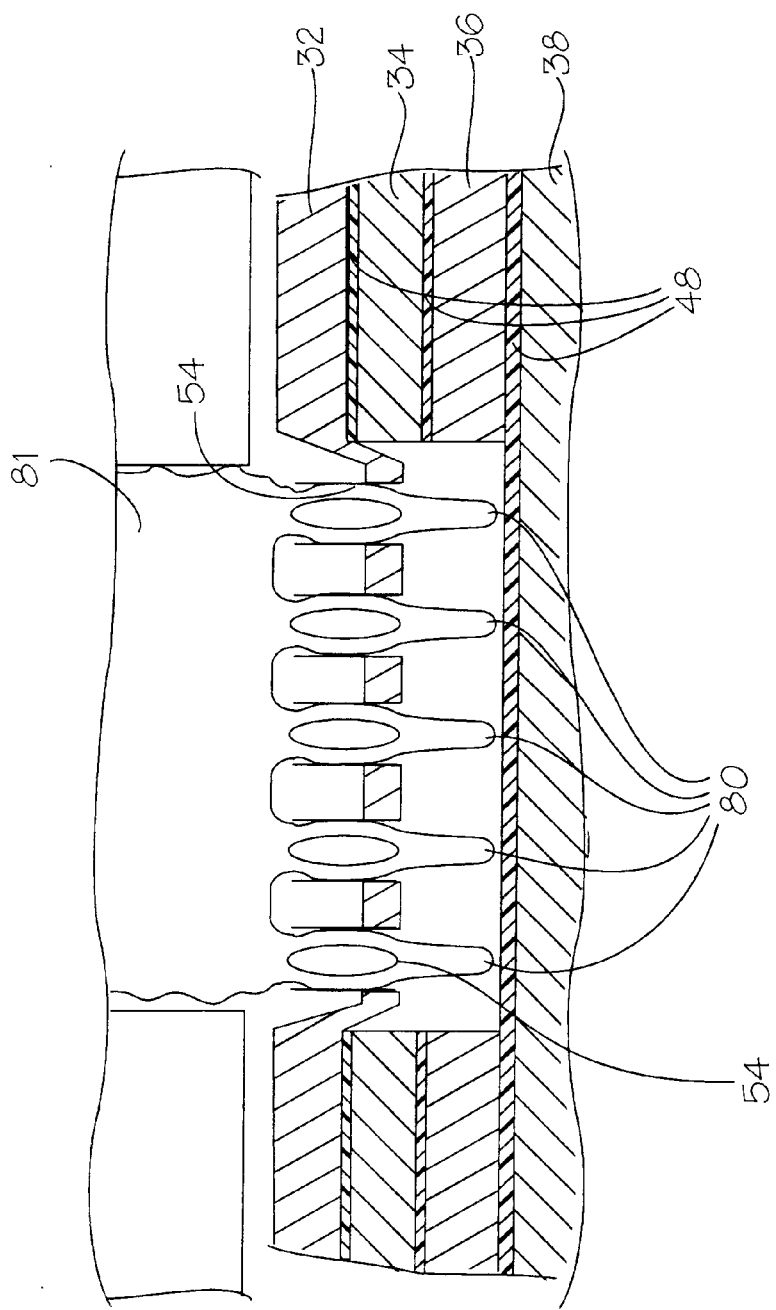

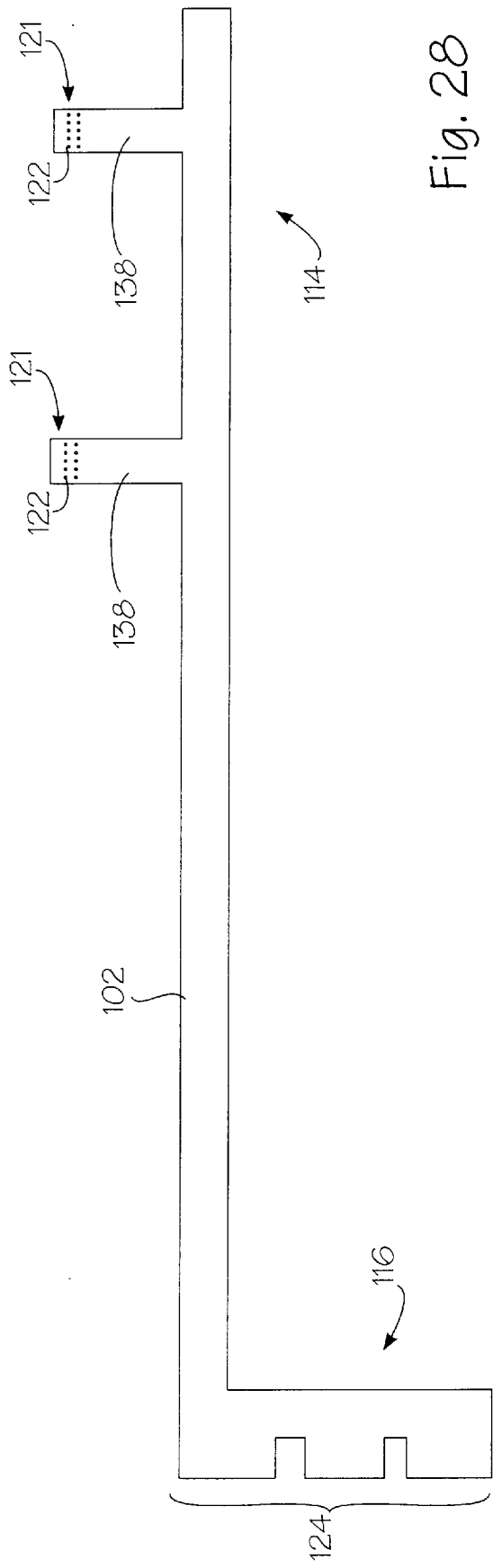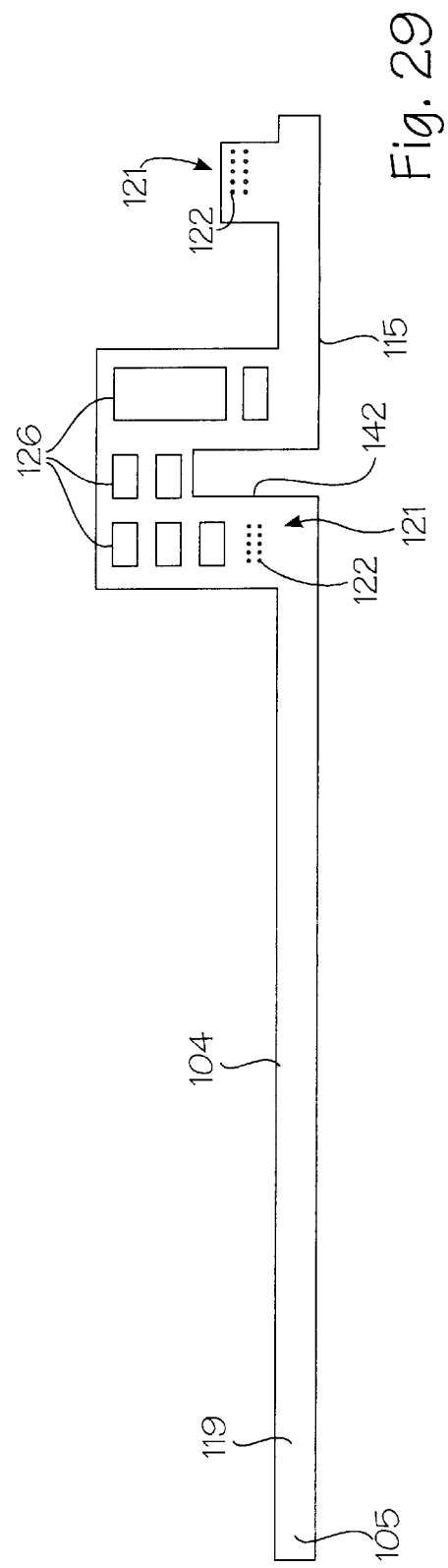

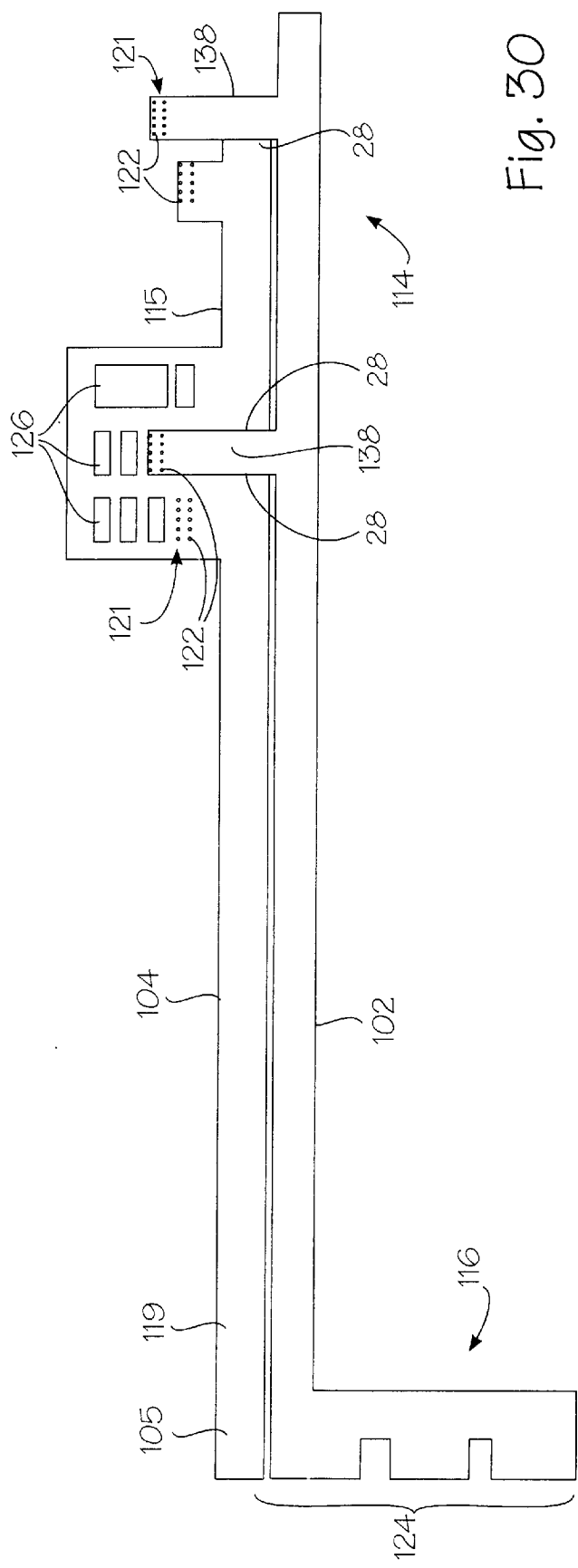
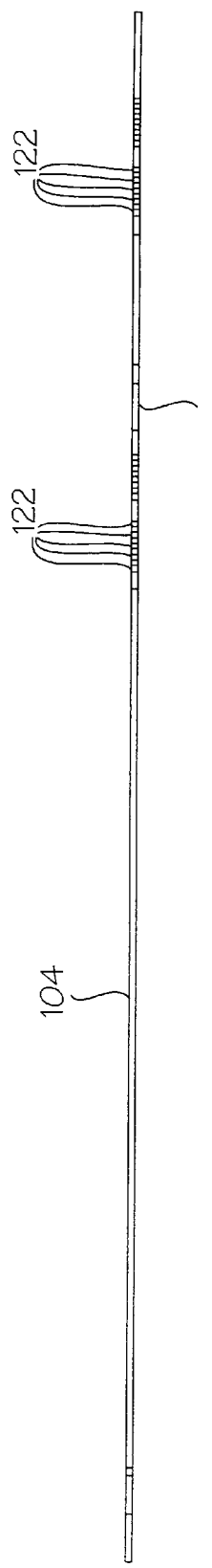

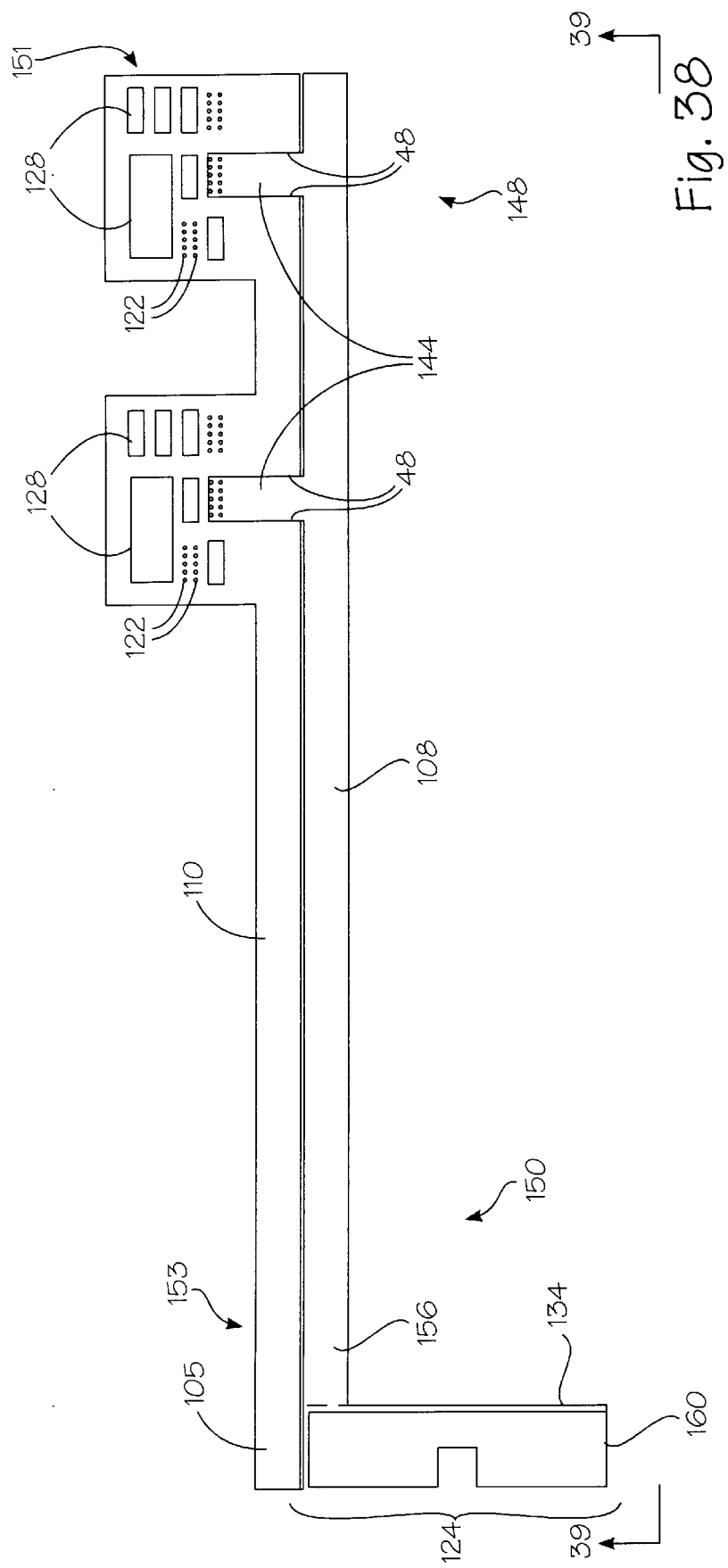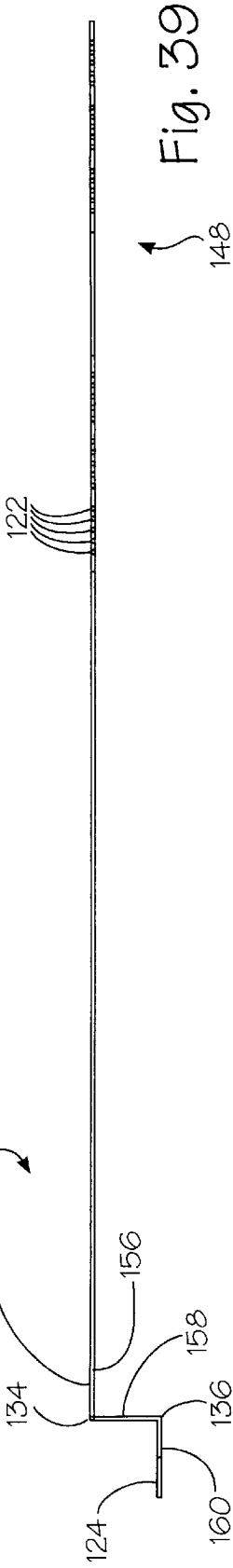

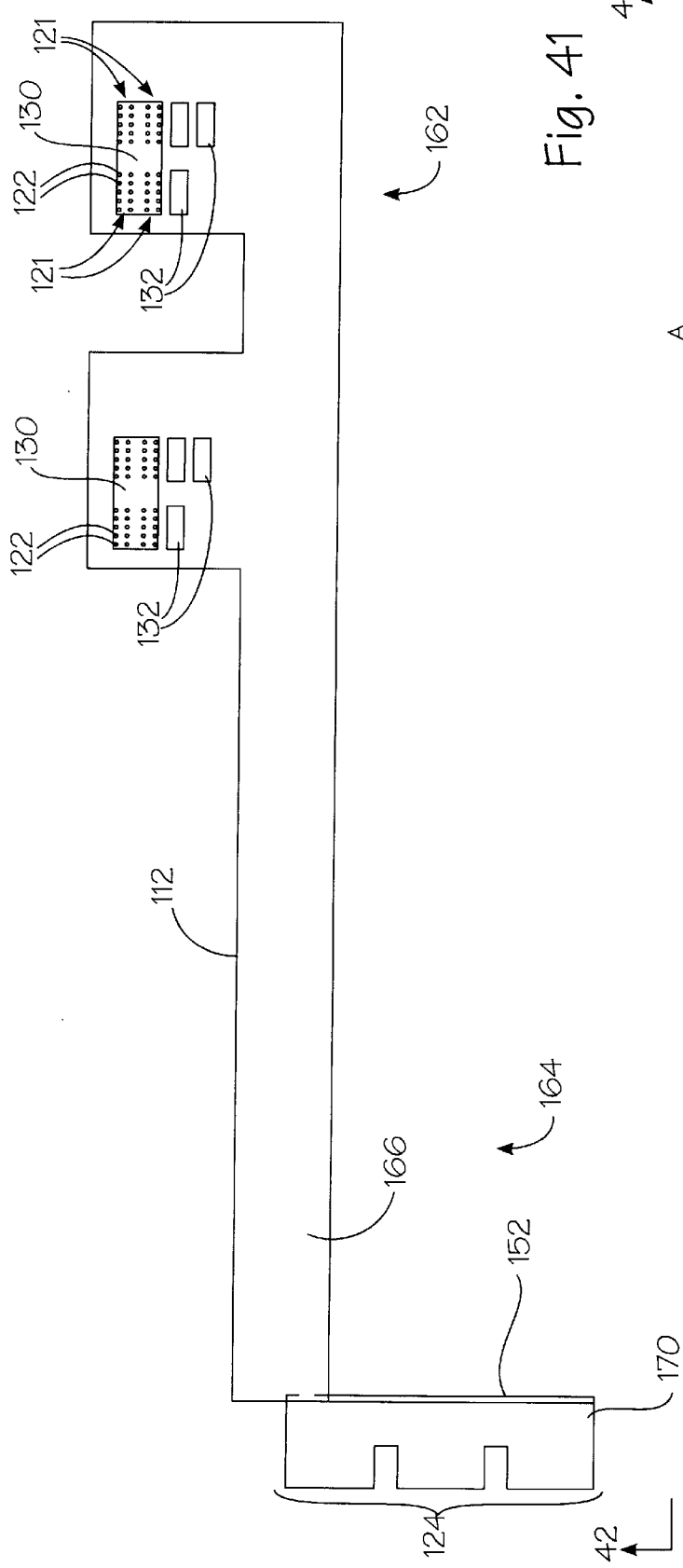
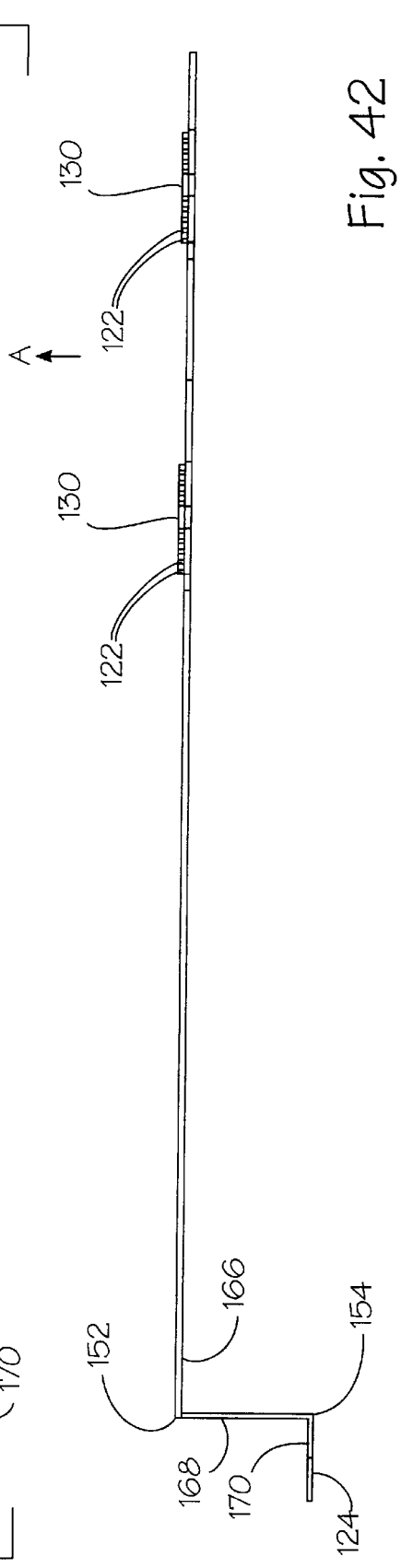
Fig. 41
Fig. 42

BUS BAR ASSEMBLY

CROSS REFERENCE TO RELATED APPLICATIONS

This application claims priority to U.S. provisional patent application Serial No. 60/101,478 filed Sep. 23, 1998, the entire contents of which are incorporated herein by this reference.

BACKGROUND OF THE INVENTION

1. Field of the Invention

The present invention relates to an electrical connection, and more particularly the invention relates to a bus bar assembly which allows multiple electronic connectors to electrically connect to separate current and voltage inputs available in the bus bar assembly.

2. Brief Description of the Related Art

A bus bar assembly connects and isolates multiple current and voltage inputs to enable the bus bar to connect to multiple electronic devices with different power requirements. Known bus bar assemblies and the electrical connectors which mate with the bus bar assembly are costly to manufacture.

Generally, there are two types of electrical connectors associated with joining multiple printed circuit boards together (i.e., connecting a mother board to a daughter board). Firsi, power connectors transmit electrical energy between interconnected printed circuit boards. Second, signal connectors transmit operating signals between interconnected printed circuit boards.

SUMMARY OF THE INVENTION

It would be desirable to provide a bus bar that does not require a soldered connection for electrically connecting to the bus bar. Where a multilayer bus bar assembly is provided, it would be desirable to make electrical connections with the multiple layers of the assembly with pin contacts of equal length to reduce the number of differing sized pin contacts required for connection to the assembly.

A bus bar assembly is provided that includes a plurality of bus bars having substantially planar portions disposed in juxtaposition. Means is disposed between adjacent bus bars for electrically isolating the adjacent bus bars from each other. The portion of each of the bus bars is made from an electrically conductive material and has a region provided with at least 5 one interconnect hole extending through the bus bar and adapted to cooperatively receive a pin member. The regions of the bus bars are disposed substantially in a plane so as to permit pin members of equal lengths to be utilized for making electrical connections with the bus bars.

BRIEF DESCRIPTION OF THE DRAWINGS

FIG. 1 is a perspective view of a bus bar assembly having six bus bars arranged in layers in accordance with one embodiment of the present invention;

FIG. 2 is a front view of a first bus bar from the assembly of FIG. 1 having two sets of openings and two embossed regions;

FIG. 3 is a cross-sectional view taken along line 3—3 of the first bus bar of FIG. 2;

FIG. 4 is a top view of the first bus bar in FIG. 2;

FIG. 5 is a front view of a second bus bar from the assembly having two sets of openings and two sets of a plurality of bores;

FIG. 6 is a cross-sectional view taken along line 6—6 of the second bus bar of FIG. 5;

FIG. 7 is a top view of the second bus bar of FIG. 5;

FIG. 8 is a front view of a third bus bar from the assembly of FIG. 1 having two sets of openings and two embossed regions;

FIG. 9 is a cross-sectional view taken along line 9—9 of the third bus bar of FIG. 8;

FIG. 10 is a top view of the third bus bar of FIG. 8;

FIG. 11 is a front view of a fourth bus bar from the assembly of FIG. 1 having two sets of openings and two embossed regions;

FIG. 12 is a cross-sectional view taken along line 12—12 of the fourth bus bar of FIG. 11;

FIG. 13 is a top view of the fourth bus bar of FIG. 11;

FIG. 14 is a front view of a fifth bus bar from the assembly of FIG. 1 having two sets of openings and two sets of a plurality of bores;

FIG. 15 is a cross-sectional view taken along line 15—15 of the fifth bus bar of FIG. 14;

FIG. 16 is a top view of the fifth bus bar of FIG. 14;

FIG. 17 is a front view of a sixth bus bar from the assembly of FIG. 1 having two sets of openings and two embossed regions;

FIG. 18 is a cross-sectional view taken along line 18—18 of the sixth bus bar of FIG. 17;

FIG. 19 is a top view of the sixth bus bar of FIG. 17;

FIG. 23 is a top view of detail F of FIG.21B;

FIG. 28 is a front view of a first bus bar from the assembly of FIG. 25;

FIG. 29 is a front view of a second bus bar of the assembly of FIG. 25;

FIG. 30 is a front view of the first and second bus bars of FIGS. 28 and 29 arranged in a plane;

FIG. 31 is a top view of first and second bus bars of FIG. 30;

FIG. 38 is a front view of the fourth and fifth bus bars of FIGS. 36 and 37;

FIG. 39 is a bottom view of the fourth and fifth bus bars of FIG. 38 taken along the line 39—39 of FIG. 38;

FIG. 41 is a front view of a sixth bus bar from the assembly of FIG. 25 having two sets of openings and two sets of embossed regions;

FIG. 42 is a bottom view of the sixth bus bar of FIG. 41 taken along the line 42—42 of FIG. 41;

DETAILED DESCRIPTION OF THE PREFERRED EMBODIMENTS

In general, the present invention relates to a bus bar assembly and electrical connector system for providing electrical connections between power supplies, or the like, and electrical components requiring different voltages or electrical currents. The invention includes a bus bar assembly of multiple layers with embossed areas on some layers and corresponding openings in other layers associated with a joining electrical connector system. The multiple layers provide common layers for providing electrical connections between power supplies, or the like, and electrical components requiring different voltages or electrical currents.

In accordance with one aspect of the present invention, a bus bar assembly includes a plurality of bus bars mounted in parallel and juxtaposed in a plane. Interposed between each bus bar is insulating material, such as tedlar mylar. The bus bars have multiple openings which accommodate embossed regions in an adjacent bus bar(s) or allow access by pin contacts to a non-adjacent bus bar(s). A plurality of bores extend through the embossed regions to receive the pin contacts, or the like. Likewise, a plurality of bores extend through bus bars without embossed regions to receive the pin contacts, or the like. Vertical and/or horizontal tabs located at the opposite end of the through openings can connect electrical devices.

Figure 20:
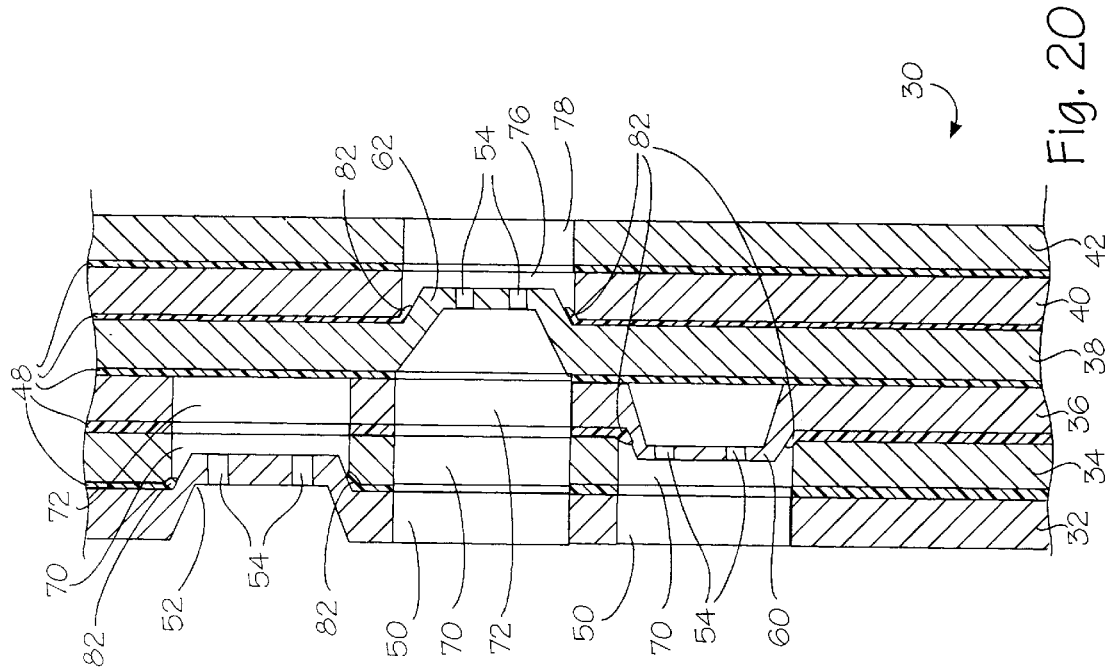
FIG. 20 is an enlarged cross-sectional view taken along line 20—20 of the bus bar assembly of FIG. 1.

Referring to one embodiment of the invention in FIGS. 1 and 20, a bus bar assembly 30 is provided that includes a laminate structure having a plurality of substantially planar bus bars 32,34,36,38,40,42 arranged in layers (FIGS. 1 and 20 show six bus bars mounted in parallel). The bus bars are each made of an suitable electrically conductive material, including but not limited to copper, aluminum, or gold and can have a thickness ranging from 0.050 to 0.062 inch. Interposed between each bus bar 32, 34, 36, 38,40, 42 is a layer 48, shown in FIG. 20, of any suitable insulating material such as tedlar mylar.

FIGS. 2–4 show a first bus bar 32 having a substantially planar portion or first end 44 and a second end 46. The first end 44 has a plurality of recesses or openings 50 (FIG. 2 shows two sets of eight openings) extending transversely through the bus bar 32 and two embossed regions 52 raised in the direction of the arrow A. The openings 50 provide access to some of if not all of the second, third, fourth, fifth, and sixth bus bars 34,36,38,40,42. At least one interconnect hole or bore and as shown a plurality of bores 54 (FIG. 2 shows eight groups of ten bores) extend through the embossed regions 52 forming socket contacts to receive power pin contacts 80 (shown in FIGS. 21A, 21B, and 23), or the like. Bores 54 are arranged in a pattern 55 which preferably includes a plurality of rows and more preferably two rows with five bores 54 in each row. The second end 46 has a plurality of connectors in the form of vertical tabs 56 (FIGS. 2 and 4 show two tabs) and an additional connector in the form of horizontal tab 58 for permitting electrical connection to the bus bar by, for example, an electrical device (not shown). It should be appreciated that any number of such connectors having any suitable shape can be provided on bus bar 32 and/or the other bus bars 34,36,38,40 and 42 of assembly 30. The openings may alternatively comprise other suitable shapes than those shown, including but not limited to elliptical, oblong, rectangular, or hexagonal.

FIGS. 5–7 show a second bus bar 34 having a substantially planar portion or first end with a plurality of recesses or openings 70 (FIG. 5 shows two sets of seven holes or openings) extending transversely through the bus bar which accommodate the embossed regions 52 of the first bus bar 32 or provide access to some or all of the third, fourth, fifth, or sixth bus bars 36, 38, 40, 42 (shown in FIG. 20). At least one and as shown a plurality of bores 54 (FIG. 5 shows two groups or patterns 55 of ten bores 54 each) extend transversely through the second bus bar 34 forming socket contacts to receive power pin contacts 80 (shown in FIGS. 21 and 23), or the like. The openings 70 may alternatively comprise other suitable shapes than those shown, including but not limited to elliptical, oblong, rectangular, or hexagonal. Second bus bar 34 has a second end 35 provided with one or more electrical connectors for permitting electrical contact with the bus bar. Specifically, the second bus bar 34 has as plurality of two vertical tabs 56.

FIGS. 8–10 show a third bus bar 36 having a substantially planar portion or first end with a plurality of recesses or openings 72 (FIG. 8 shows two sets of ten holes or openings 72) extending transversely through the bus bar and two embossed regions 60 raised from a plane of the bus bar in the direction of the arrow B. The embossed regions 60 are received in the openings 70 of the second bus bar 34. The openings 72 provide access to some or all of the fourth, fifth, and sixth bus bars 38, 40, 42. At least one and as shown a plurality of bores 54 (FIG. 8 shows four groups or patterns 55 of ten bores 54 each) extend transversely through the embossed regions 60 forming socket contacts to receive power pin contacts 80 (shown in FIGS. 21A, 21B, and 23), or the like. The openings 72 may alternatively comprise other suitable shapes than those shown, including but not limited to elliptical, oblong, rectangular, or hexagonal. Third bus bar 36 has a second end 39 provided with one or more electrical connectors for permitting electrical contact with the bus bar. Specifically, the third bus bar 36 has as plurality of three vertical tabs 56.

FIGS. 11–13 show a fourth bus bar 38 having a substantially planar portion or first end with a plurality of recesses or openings 74 (FIG. 11 shows two sets of two holes or openings 74) extending transversely through the bus bar and two embossed regions 62 raised in the direction of the arrow A. The openings 74 provide access to one or both of the fifth and sixth bus bars 40, 42. At least one and as shown a plurality of bores 54 extend through the embossed regions 62 forming socket contacts to receive power pin contacts 80 (shown in FIGS. 21 and 23), or the like. FIG. 11 shows six groups or patterns 55, with each such pattern 55 having two rows of five bores 54 each. The openings 74 may alternatively comprise other suitable shapes than those shown, including but not limited to elliptical, oblong, rectangular, or hexagonal. Fourth bus bar 38 has a second end 41 provided with one or more electrical connectors for permitting electrical contact with the bus bar. Specifically, the fourth bus bar 38 has as plurality of three vertical tabs 56.

FIGS. 14–16 show a fifth bus bar 40 having a substantially planar portion or first end with a plurality of recesses or openings 76 (FIG. 14 shows a pair of holes or openings 76) extending transversely through the bus bar which accommodate the embossed regions 62 of the fourth bus bar 32 or provide access to the sixth bus bar 42, shown in FIG. 20. At least one and as shown a plurality of bores 54 (FIG. 5 shows two groups of ten bores) extend transversely through the fifth bus bar 40 forming socket contacts to receive power pin contacts 80 (shown in FIGS. 21A, 21B, and 23), or the like. The openings 76 may alternatively comprise other suitable shapes than those shown, including but not limited to elliptical, oblong, rectangular, or hexagonal. Fifth bus bar 40 has a second end 43 provided with one or more electrical connectors for permitting electrical contact with the bus bar. Specifically, the fifth bus bar 40 has as plurality of two vertical tabs 56.

FIGS. 17–19 show a sixth bus bar 42 having a substantially planar portion or first end 66 and a second end 68. The first end 66 has a plurality of recesses or openings 78 (FIG. 17 shows two sets of four holes or openings 78) extending transversely through the bus bar 42 and two embossed regions 64 raised in the direction of the arrow B. The embossed regions 64 are received in the openings 76 in the fifth bus bar 40. At least one and as shown a plurality of bores 54 (FIG. 17 shows two groups of ten bores) extend through the embossed regions 64 forming socket contacts to receive power pin contacts 80 (shown in FIGS. 21A, 21B, and 23), or the like. The second end 68 has a plurality of connectors in the form of vertical tabs 56 (FIGS. 17 and 19 show two tabs 56) and an additional connector in the form of horizontal tab 58 for permitting electrical connection to the bus bar by, for example, an electrical device (not shown). The openings 78 may alternatively comprise other suitable shapes than those shown, including but not limited to elliptical, oblong, rectangular, or hexagonal.

As shown in FIGS. 20–23, the first bus bar 32 has an embossed region 52 having at least one and as shown a plurality of bores 54 extending through the embossed region forming socket contacts and openings 50 for permitting access to the bus bars underlying the first bus bar. As shown most clearly in FIG. 22, the bores 54 receive pin contacts 80 of a length L, and an electrical connection is formed between the first bus bar 32 and the pin contacts. The second bus bar 34 has openings 70. The third bus bar 36 has an embossed region 60 having bores 54 extending transversely through the embossed region forming socket contacts and openings 72.

Figure 21B:
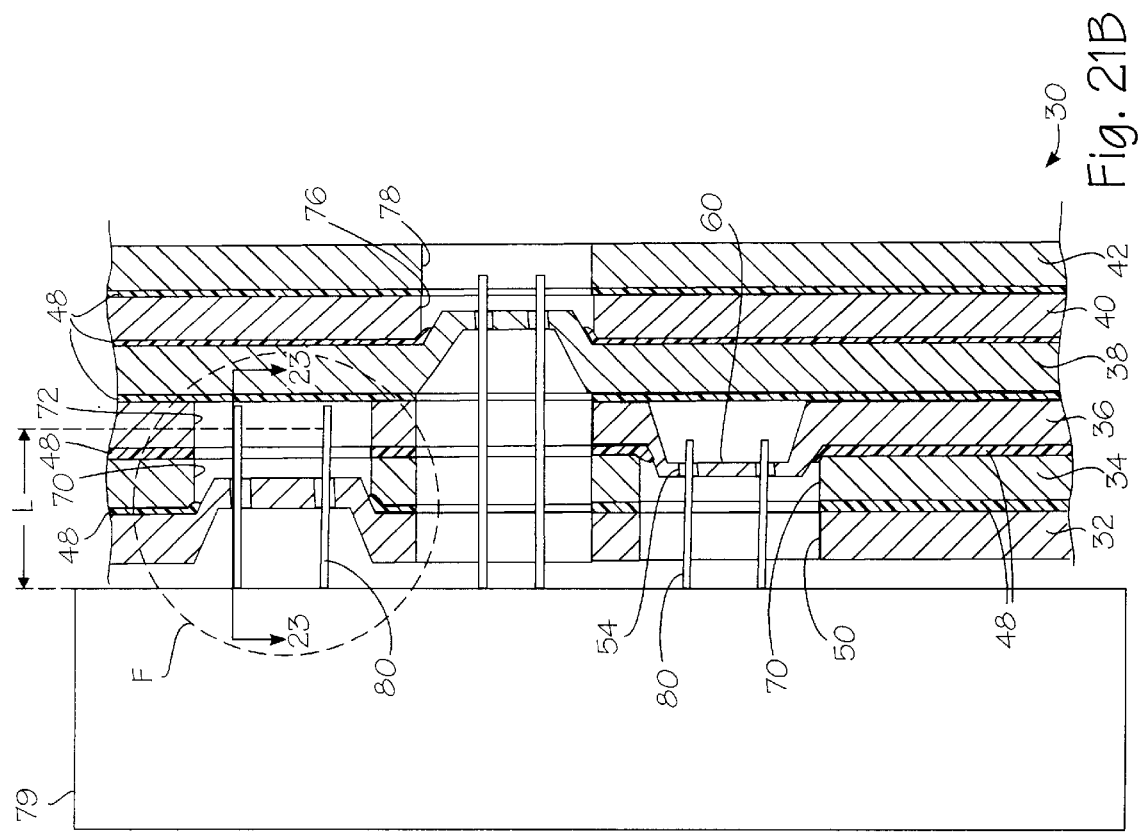
FIG. 21B is an enlarged cross-sectional view of the mating element mating with the bus bar assembly of FIG. 20.
Figure 21A:
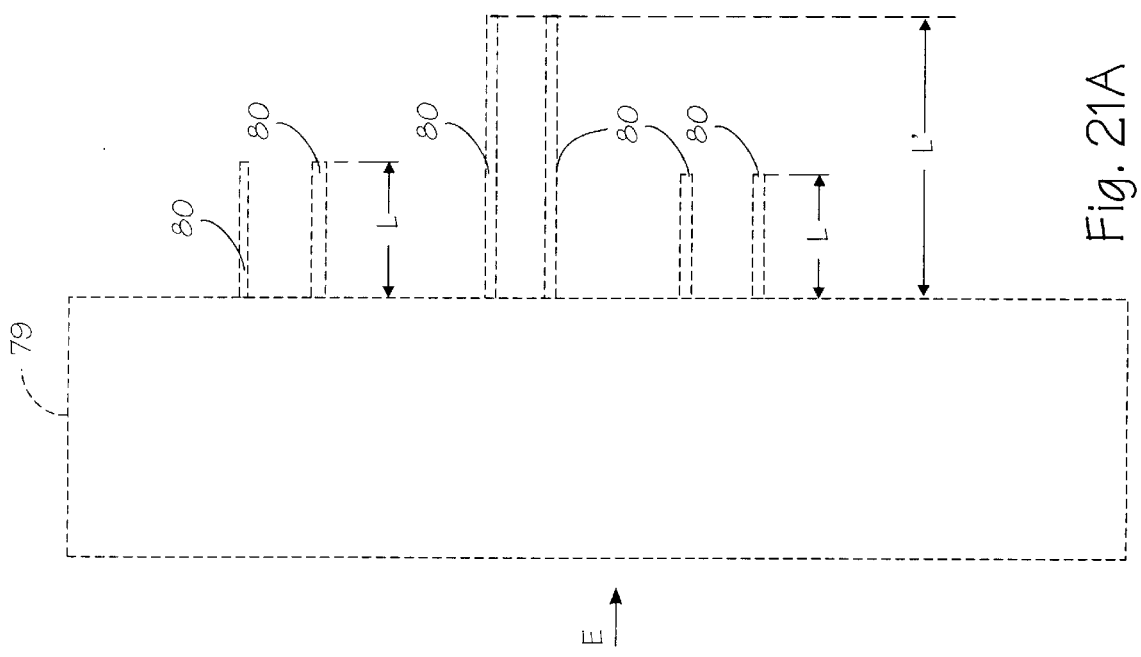
FIG. 21 A is an enlarged cross-sectional view of a mating element with pin contacts for mating with the bus bar assemble of FIG. 20.
Figure 23A:
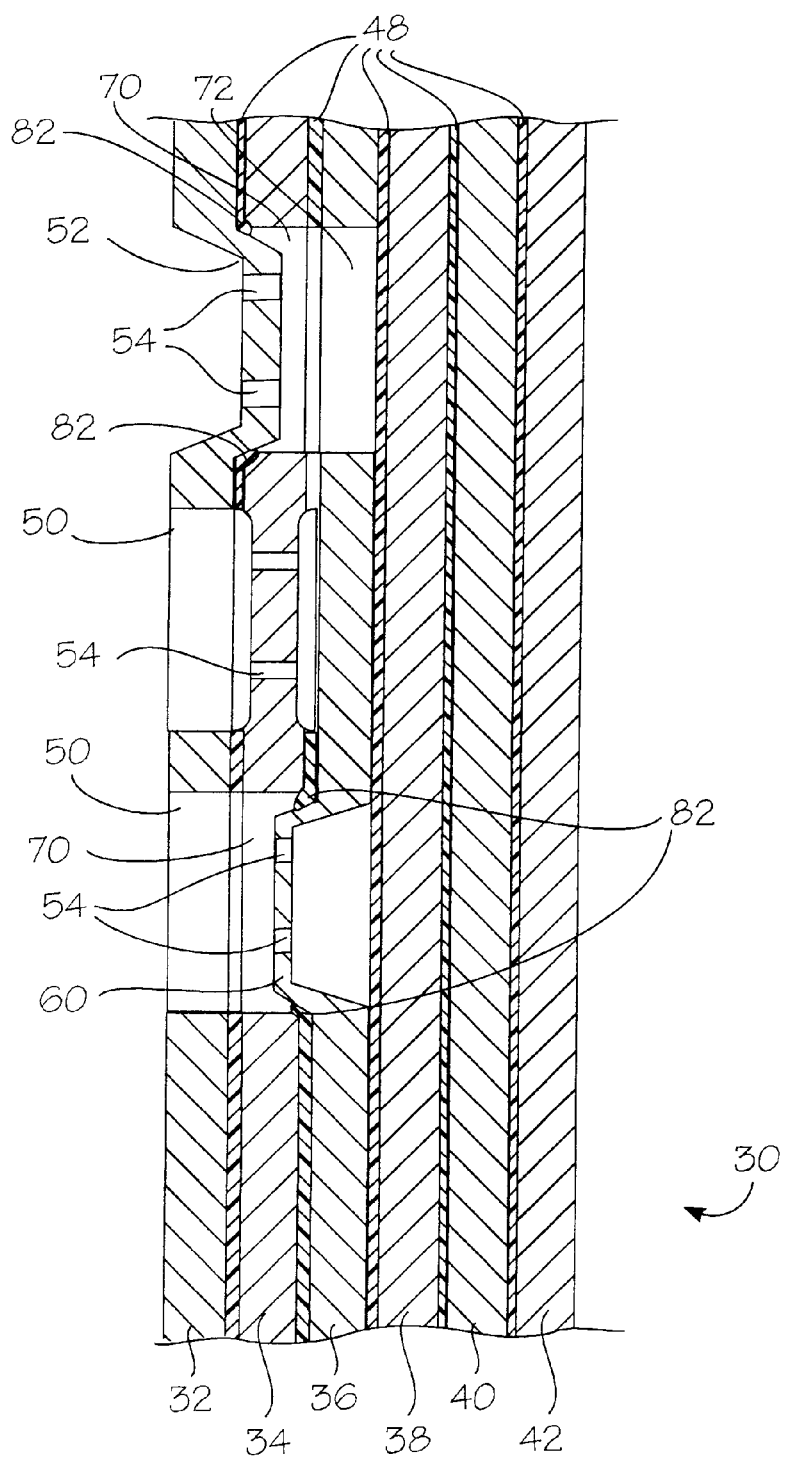
FIG. 23A is a cross-sectional view of the bus bar assembly of FIG. 1 taken along the line 23A—23A of FIG. 1.

A mating element 79, a portion of which is shown in FIGS. 21A and 21B, carrying a plurality of contact pins 80 can be used with bus bar assembly 30 for making electrical contact with the assembly 30. The mating element 79 is movable from a first or disengaged position, shown in FIG. 21A, to a second or engaged position, shown in FIG. 21B. As shown in FIG. 21B, the pin contacts 80 of a length L and can extend beyond the bus bars 32, 34, through the openings 50, 70, and through the insulating means or layer 48 to be received by the bores 54 in the embossed region 60 of the third bus bar 36. As shown most clearly in FIG. 23, an electrical connection is formed between the third bus bar 36 and the pin contacts 80. The pin contacts 80 of length L can also be used for forming an electrical connection with the embossed portion of the second bus bar 34 (see FIG. 23A). Thus, it can be seen that the bar assembly 30 permits a set of pin contacts 80, all of a single length L, to be utilized for forming a solderless, press-fit electrical connection with three parallel-aligned bus bars which are part of a laminate-type structure. Bus bar assembly, as seen in FIG. 23A, provides a substantially single plane socket assembly, formed for example by the embossed regions of bus bars 32, 34 and 36, in a multiplane bus bar assembly.

Similarly, a set of pin contacts 80, all of a single length L', can be used for forming an electrical connection in a plurality of juxtaposed bus bars such as bus bars 38, 40 and 42. The bus bars 38, 40 and 42, like bus bars 32, 34 and 36, have respective regions provided with at least one hole 54 disposed in the plane of one of the bus bars. In the illustrated embodiment, such regions are disposed in the plane of fifth bus bar 40 (see FIGS. 20 and 21B. As can be seen, only pin contacts 80 of only two lengths L or L' are required to access any of the six bus bars 32, 34, 36, 38, 40, 42. An alignment pin (not shown) is used to align the bus bars 32, 34, 36, 38, 40, 42. The alignment means may alternatively comprise other suitable means, including but not limited to dowels, bars, screws, dovetails and slides, alignment barriers, and connectors. In addition, it should be appreciated that some or all of the bus bars of assembly 30 can be assessed by contact pins entering from the other side of the assembly 30, that is through sixth bus bar 42.

Figure 22:
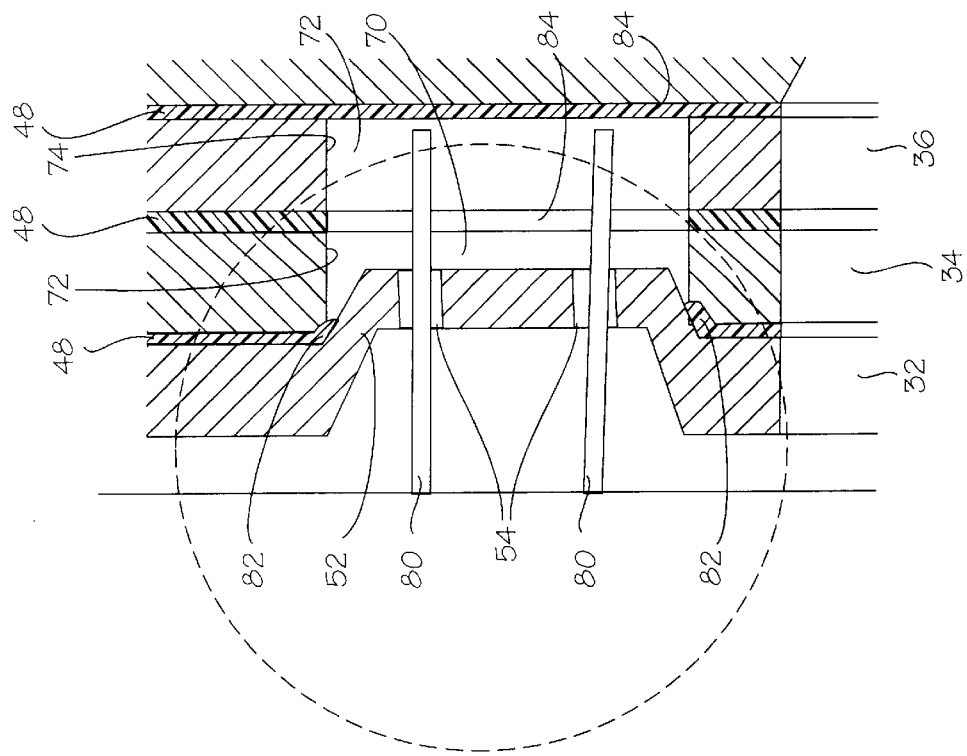
FIG. 22 is an enlarged view of the detail F of FIG. 21 B.

As shown most clearly in FIG. 22, the second bus bar 34 has a recess or opening 70 which has a larger cross-sectional area than an opening 84 in the insulating layer 48.

When the embossed region 52 of the first bus bar 32 is placed adjacent to the hole or opening 70 of the second bus bar 34 and moved such that the opening receives the embossed region, the insulating layer 48 will contact and conform to the embossed region thereby insulating a wall 82 of the opening 70 from the embossed region. Likewise, when the embossed region 60 of the third bus bar 36 is placed adjacent to the opening 70 of the second bus bar 34 and moved such that the opening receives the embossed region, the insulating layer 48 will contact and thereby insulate a wall 82 of the opening 70.

The pin contacts 80 may be shaped in any known manner. In one preferred embodiment, a plurality of pin contacts 80 are formed as part of any electrically conductive body 81 made from any suitable material such as copper (see FIG. 23). The pin contacts 80 preferably have a configuration and number to conform to the pattern 55 of socket contact holes 54 provided in the bus bars of bus bar assembly 30.

Figure 24:
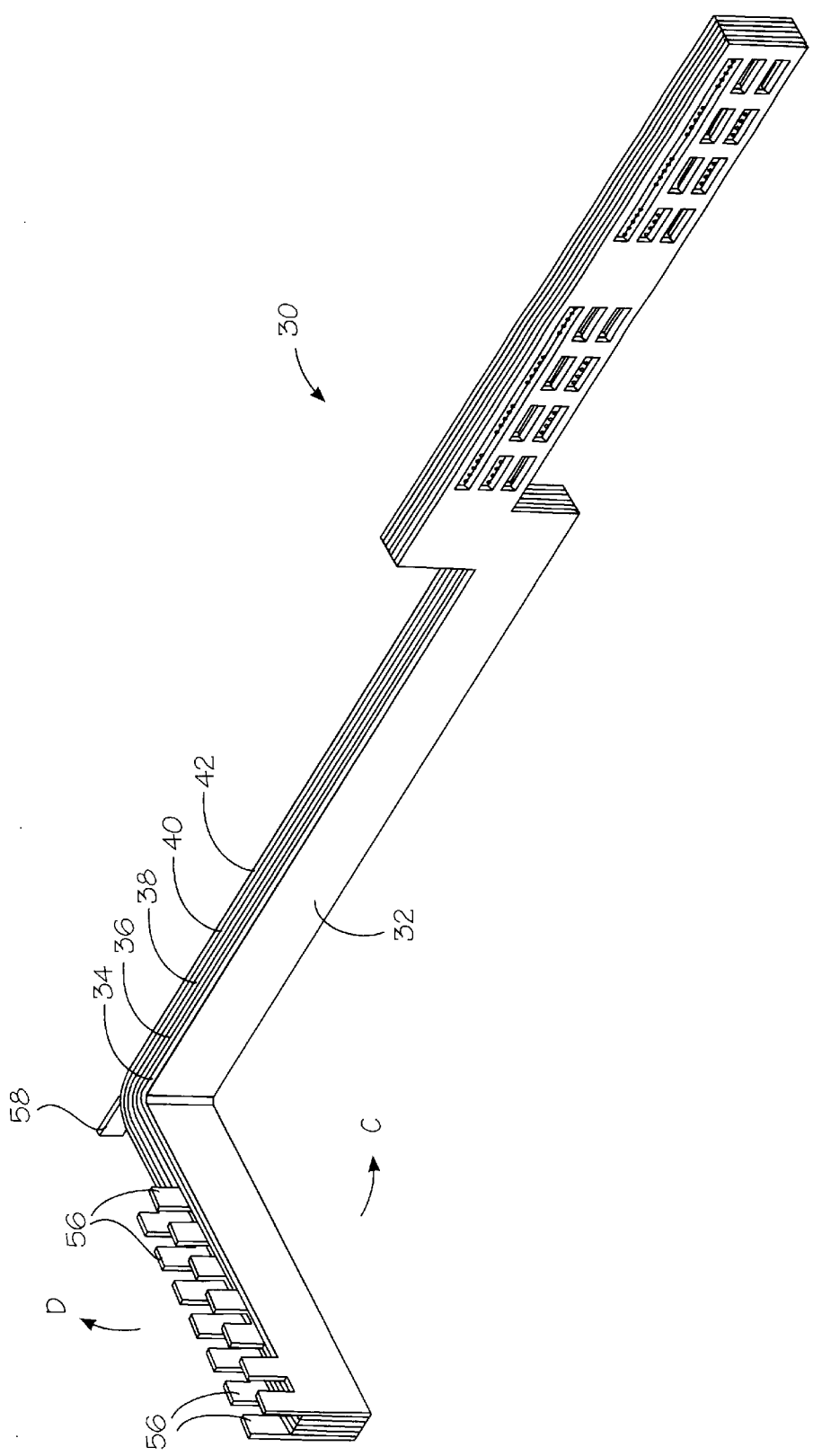
FIG. 24 is a perspective view of a second embodiment of the bus bar assembly.
Figure 25:
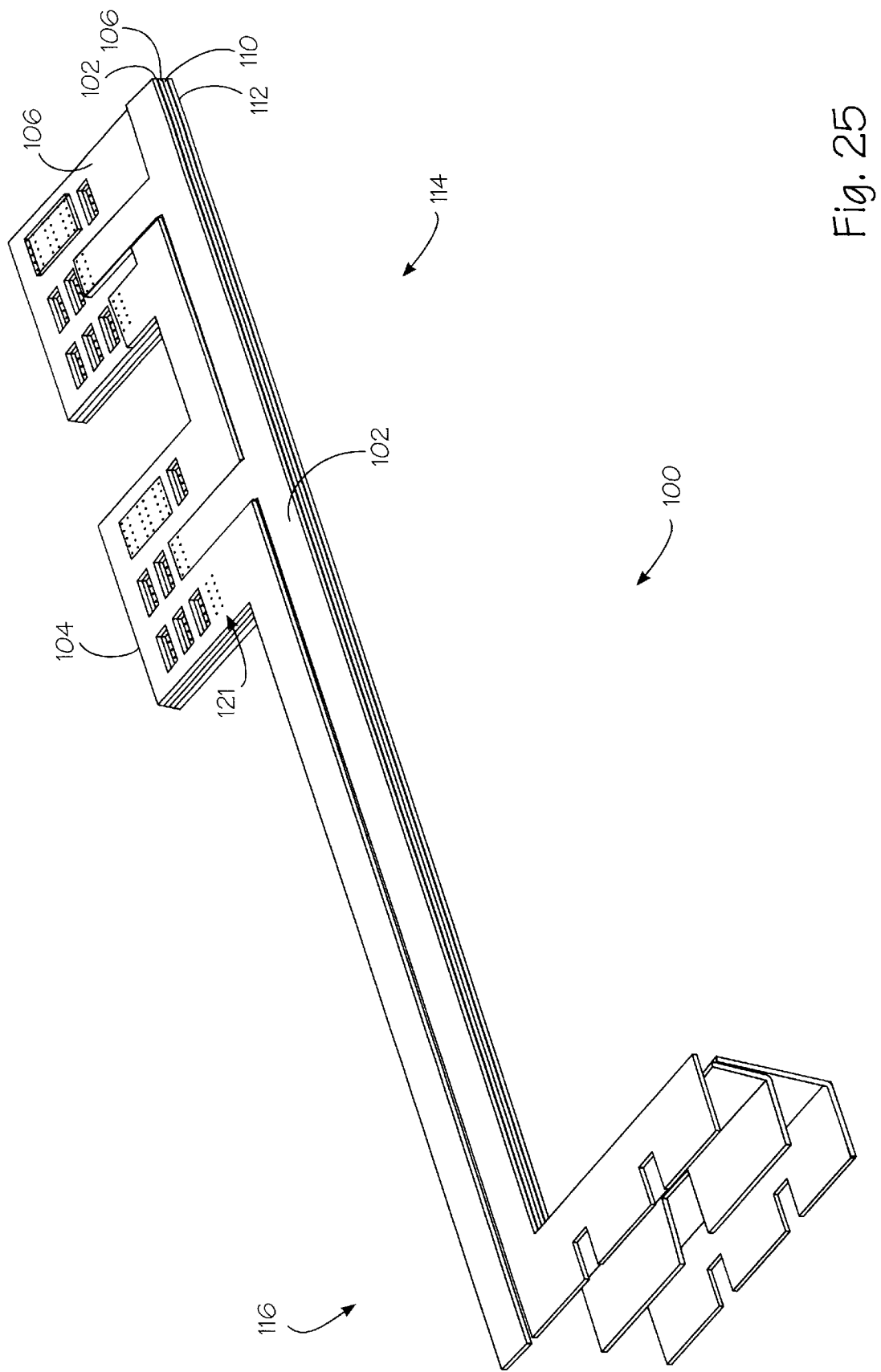
FIG. 25 is a perspective view of a third embodiment of the bus bar assembly.
Figure 26:
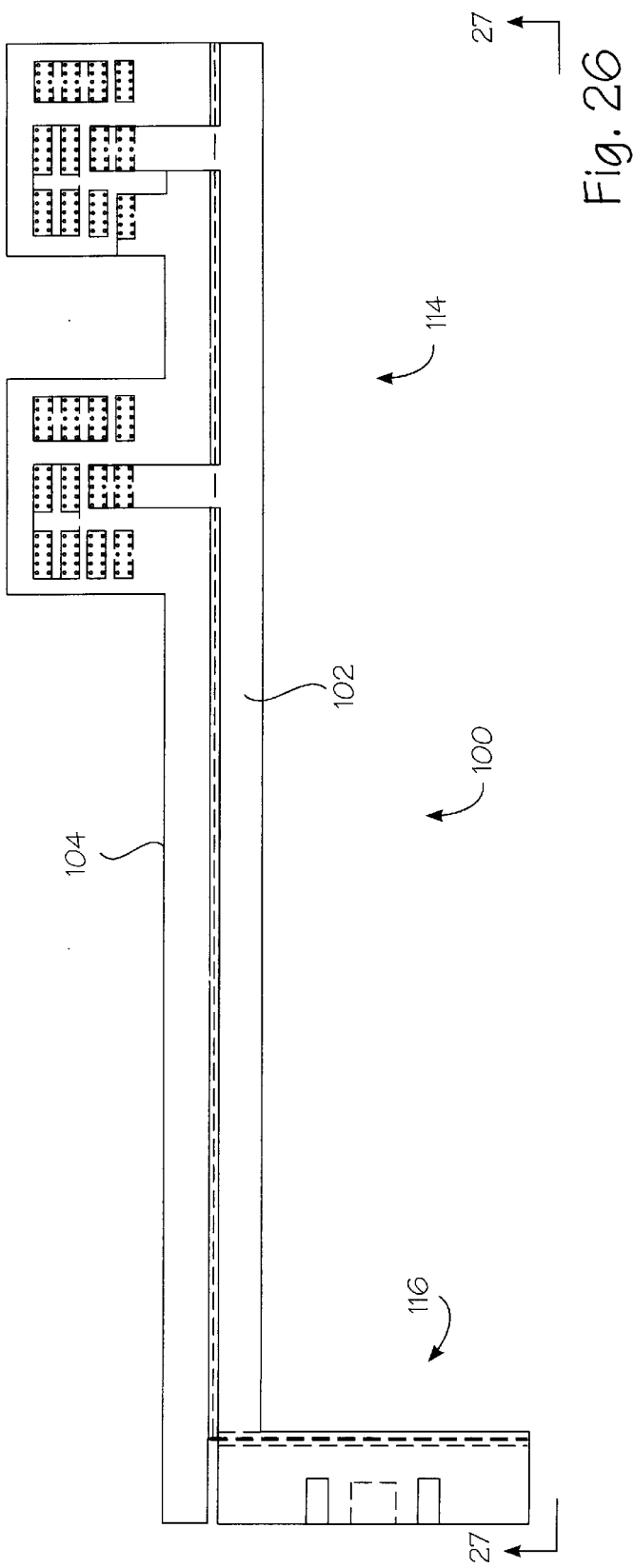
FIG. 26 is a front view of the bus bar assembly of FIG. 25.
Figure 27:
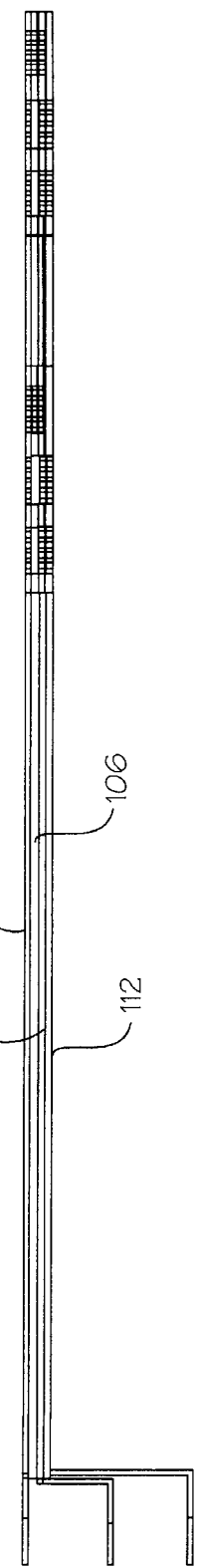
FIG. 27 is a bottom view of the bus bar assembly of FIG. 25 taken along the line 27—27 of FIG. 26.

In a second embodiment of the present invention (shown in FIG. 24), a bus bar assembly 30 may include a second end which is bent at an angle with respect to a remainder of the bus bar such as an angle of 90° or less. The second end may be bent in either the direction illustrated in FIG. 24 or in an opposite or any other direction.

In a third embodiment of the present invention (shown in FIGS. 25–39), a bus bar assembly 100 includes a plurality of bus bars 102, 104, 106, 108, 100, 110 arranged in four parallel stacked layers. Some of the stacked layers include a single bus bar while other layers include multiple bus bars. Interposed between each of the bus bars 102, 104, 106, 108, 110, 112 is layer 48 of any suitable insulating material such as tedlar mylar.

FIGS. 26–32 show a first and a second bus bar 102, 104 which are configured to be juxtaposed in a same plane. The substantially planar portion or first end 114 of the first bus bar 102 has a plurality of cantilever members 138 (FIG. 28 shows two members) which extend toward the second bus bar 104. The cantilever members 138 has at least one and preferably a plurality of interconnect holes or bores 122 extending transversely through the bus bar 102 forming socket contacts to receive pin contacts 140, or the like. In one preferred embodiment, shown in FIG. 28, each of the cantilevers 138 has a group or pattern 121 of bores 122 in which the bores are arranged in two rows with five bores 122 in each row. The second end 116 of the first bus bar 102 has a plurality of tabs 124 (FIG. 28 shows three tabs) for permitting electrical connection to the bus bar 102 by, for example, an electrical device (not shown).

As best shown in FIG. 29, the substantially planar portion or first end 115 of the second bus bar 104 has a plurality of recesses or openings 126 (FIG. 29 shows seven holes or openings 126) and a plurality of bores 122 arranged in first and second patterns 121 extending transversely through the bus bar. The openings 126 provide access to the third, fourth, fifth, and sixth bus bars 106, 108, 110, 112 or accommodate the embossed regions 120 of a third bus bar 106. The plurality of bores 122 in the second bus bar 104 form a pattern 121 of socket contacts to receive pin contacts 140, or the like.

Figure 32:
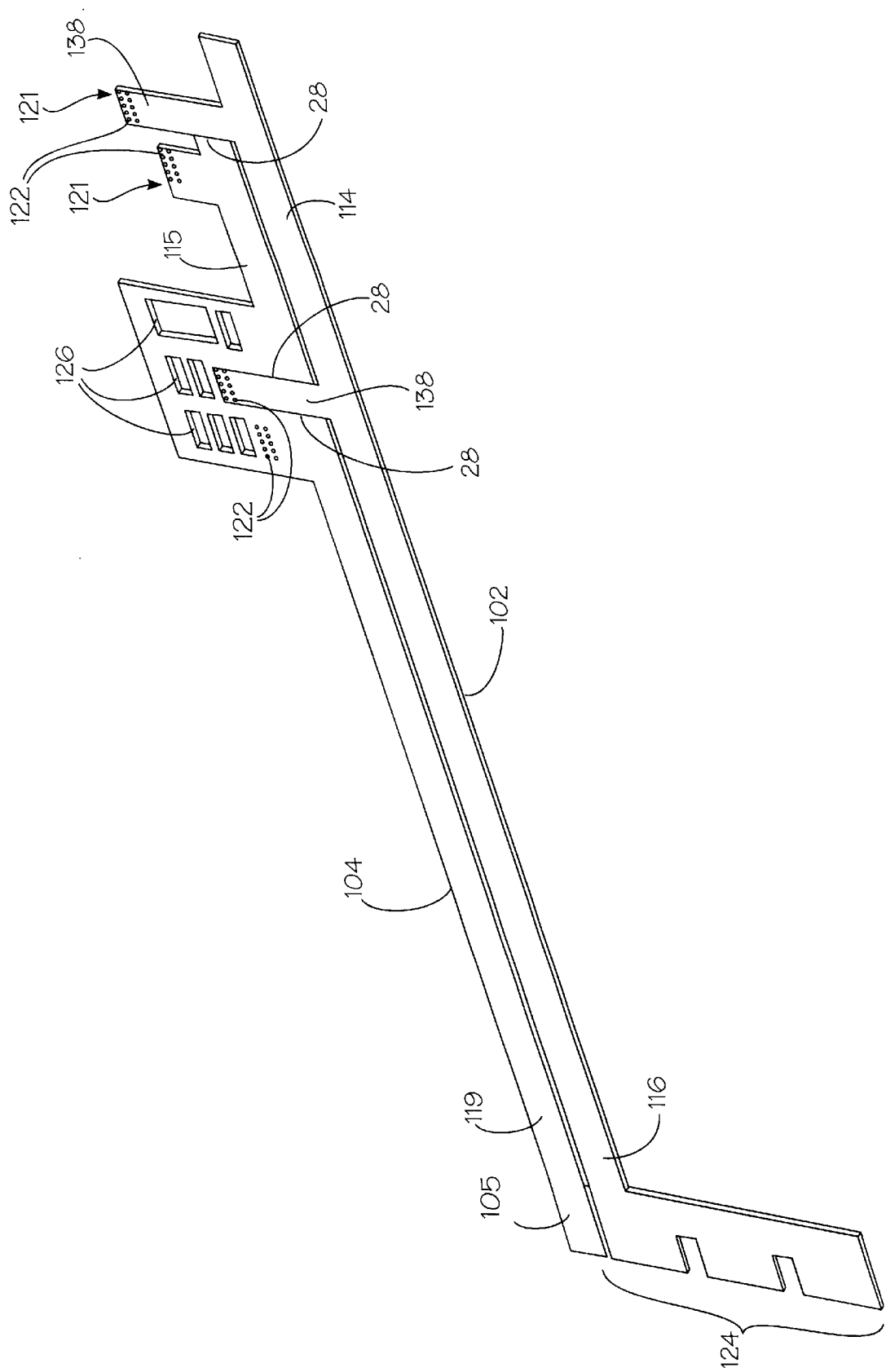
FIG. 32 is a perspective view of the first and second bus bars of FIG. 30.

The first end 114 is shaped and positioned such that the cantilever members 138 of the first bus bar 102 can be received in a corresponding slot 142 of the second bus bar 104 as illustrated in FIGS. 30–32. An insulating layer 48 electrically and physically separates the first bus bar 102 from the second bus bar 104. The second end 119 of the second bus bar 104 may alternatively have a single or a plurality of tabs 105, only one of which is shown in FIG. 29. The openings 126 in the second bus bar 104 may alternatively comprise other suitable shapes than those shown, including but not limited to elliptical, oblong, rectangular, or hexagonal.

Figure 33:
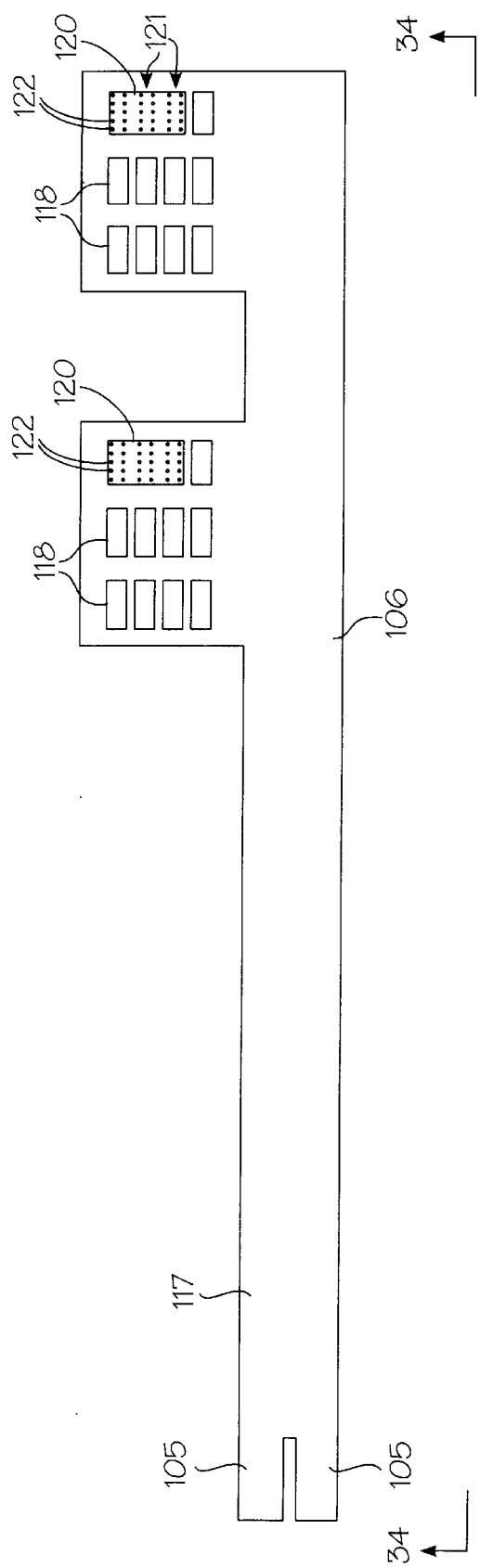
FIG. 33 is a front view of a third bus bar from the assembly of FIG. 25 having two sets of openings and two sets of embossed regions.
Figure 34:
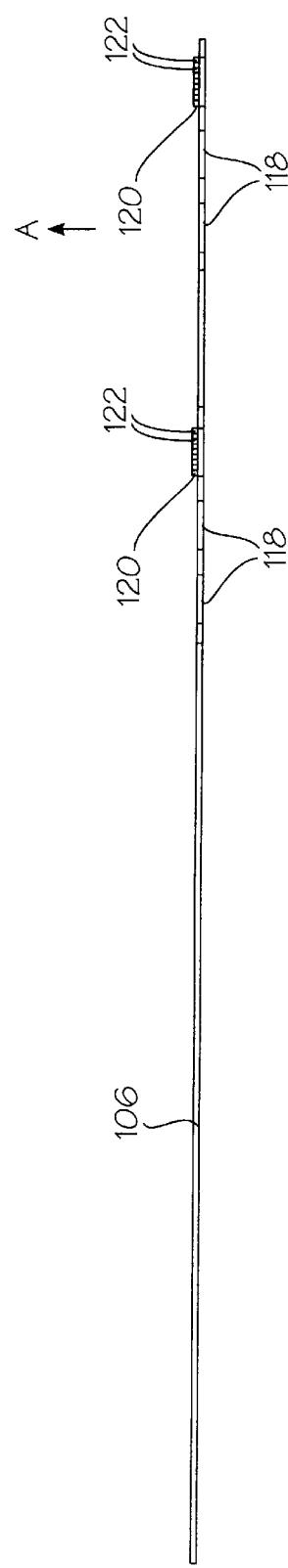
FIG. 34 is a bottom view of the third bus bar of FIG. 33 taken along the line 34—34 of FIG. 33.
Figure 35:
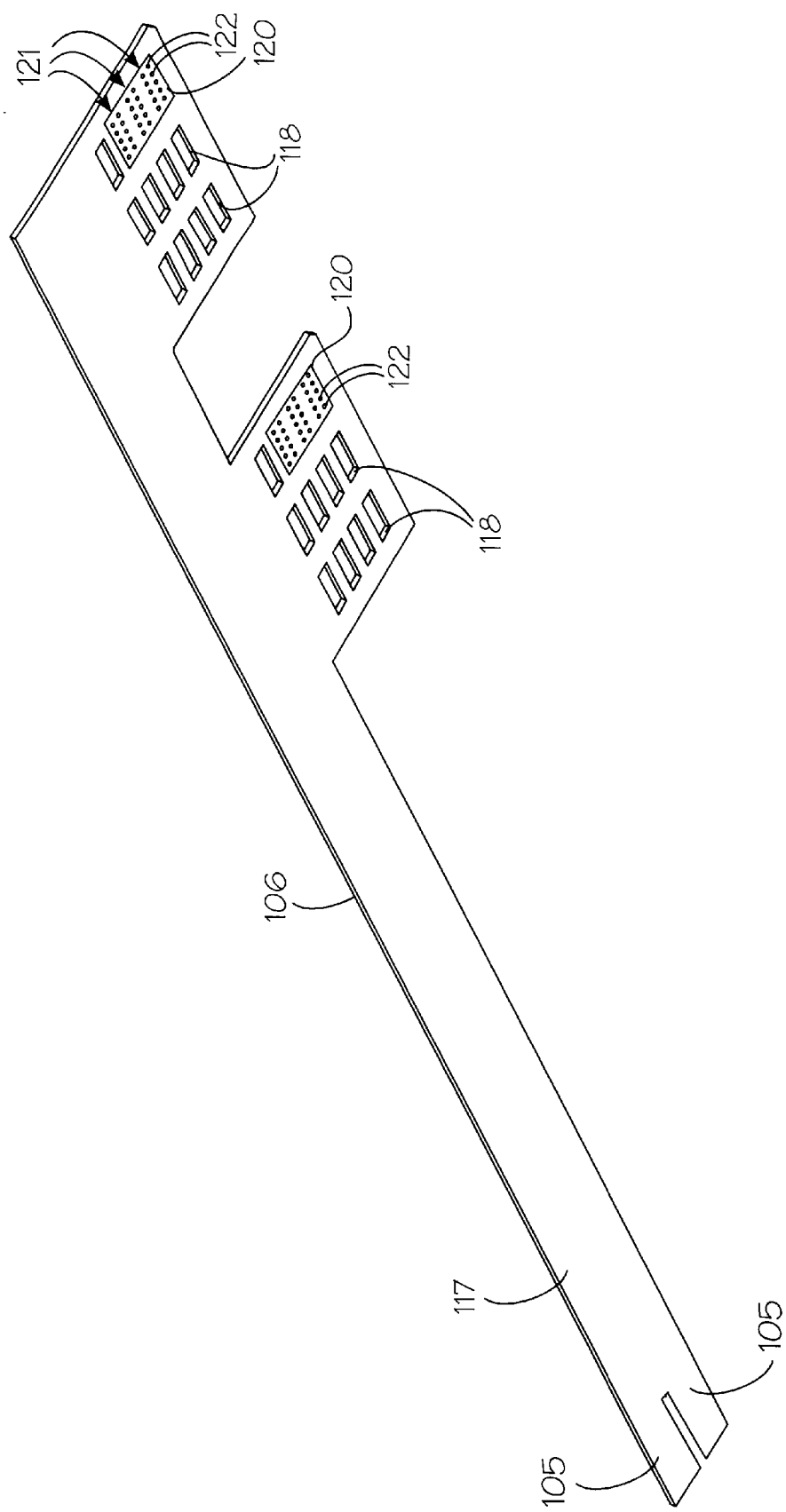
FIG. 35 is a perspective view of the third bus bar of FIG. 33.

FIGS. 33–35 show a third bus bar 106 having a plurality of recesses or openings 118 (FIG. 33 shows two sets of nine holes or openings 118) extending transversely through the substantially planar portion or first end of the bus bar and two embossed regions 120 raised in the direction of the arrow A. The third bus bar 106 is configured to correspond substantially in shape to the combination of the first and second bus bars 102, 104. The openings 118 provide access to the fourth, fifth, and sixth bus bars 108, 110, 112. A plurality of bores 122 (FIG. 33 shows six groups or patterns 121 of ten bores 122 each) extend through the embossed regions 120 forming socket contacts to receive pin contacts 140, or the like. The openings 118 may alternatively comprise other suitable shapes than those shown, including but not limited to elliptical, oblong, rectangular, or hexagonal. The second end 117 of bus bar 106 has at least one electrical connector or tab and is shown with a plurality of two tabs 105.

Figure 36:
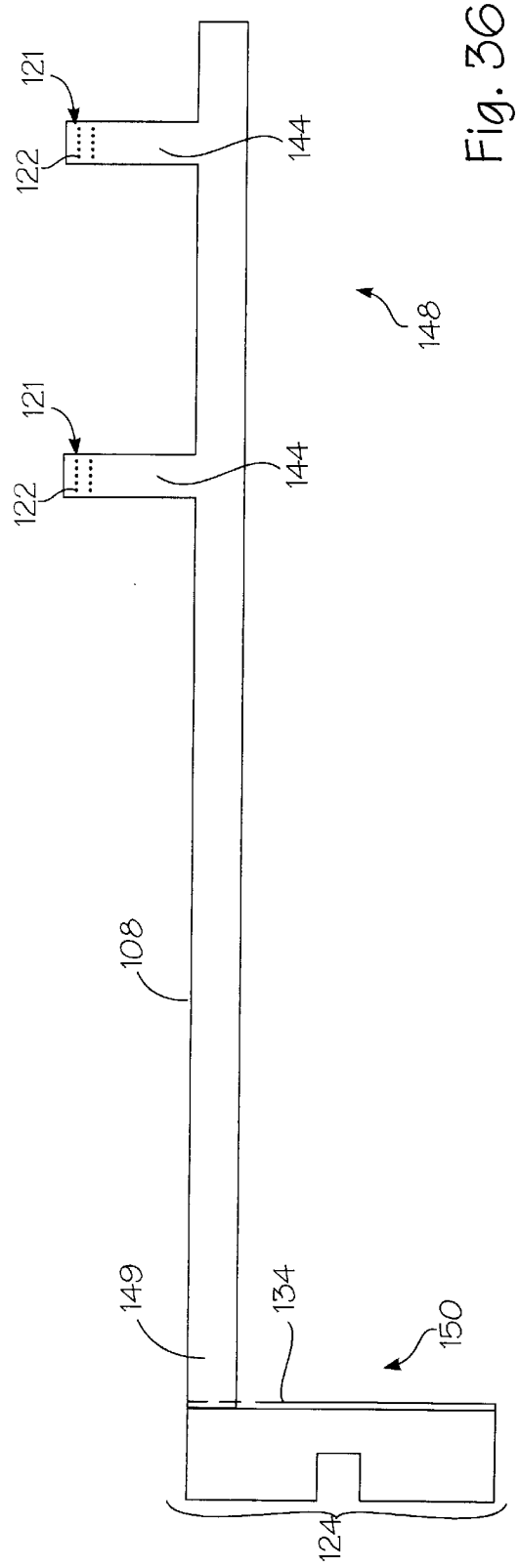
FIG. 36 is a front view of a fourth bus bar from the assembly of FIG. 25.

FIGS. 36–40 show fourth and fifth bus bars 108, 110 juxtaposed in a same plane. The substantially planar portion or first end 148 of the fourth bus bar 108 has a plurality of cantilever members 144 (FIG. 36 shows two members) which extend in the direction of the fifth bus bar 110. The cantilever members 144 have a plurality of bores 122 (FIG. 36 shows two sets or patterns 121 of ten bores each) extending transversely through the bus bar 108 forming socket contacts to receive pin contacts 140, or the like. The second end 149 of the fourth bus bar 108 has first and second bends 134, 136 as shown in FIGS. 38 and 39. The first bend 134 in the fourth bus bar 108 forms two generally perpendicular sides 156, 158. The second bend 136 in the fourth bus bar 108 forms two generally perpendicular sides 158, 160. At least one and as shown in FIG. 36 a plurality of two tabs 124 extend from the side 160 for permitting electrical connection to the bus bar 108.

Figure 37:
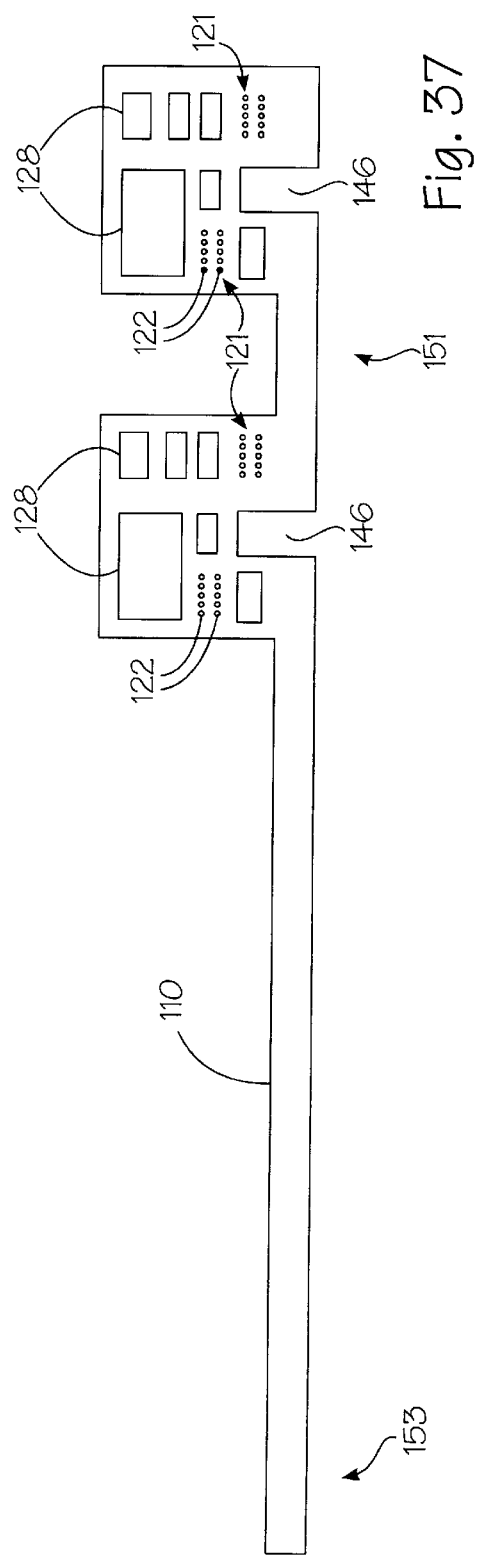
FIG. 37 is a front view of a fifth bus bar from the assembly of FIG. 25.
Figure 40:
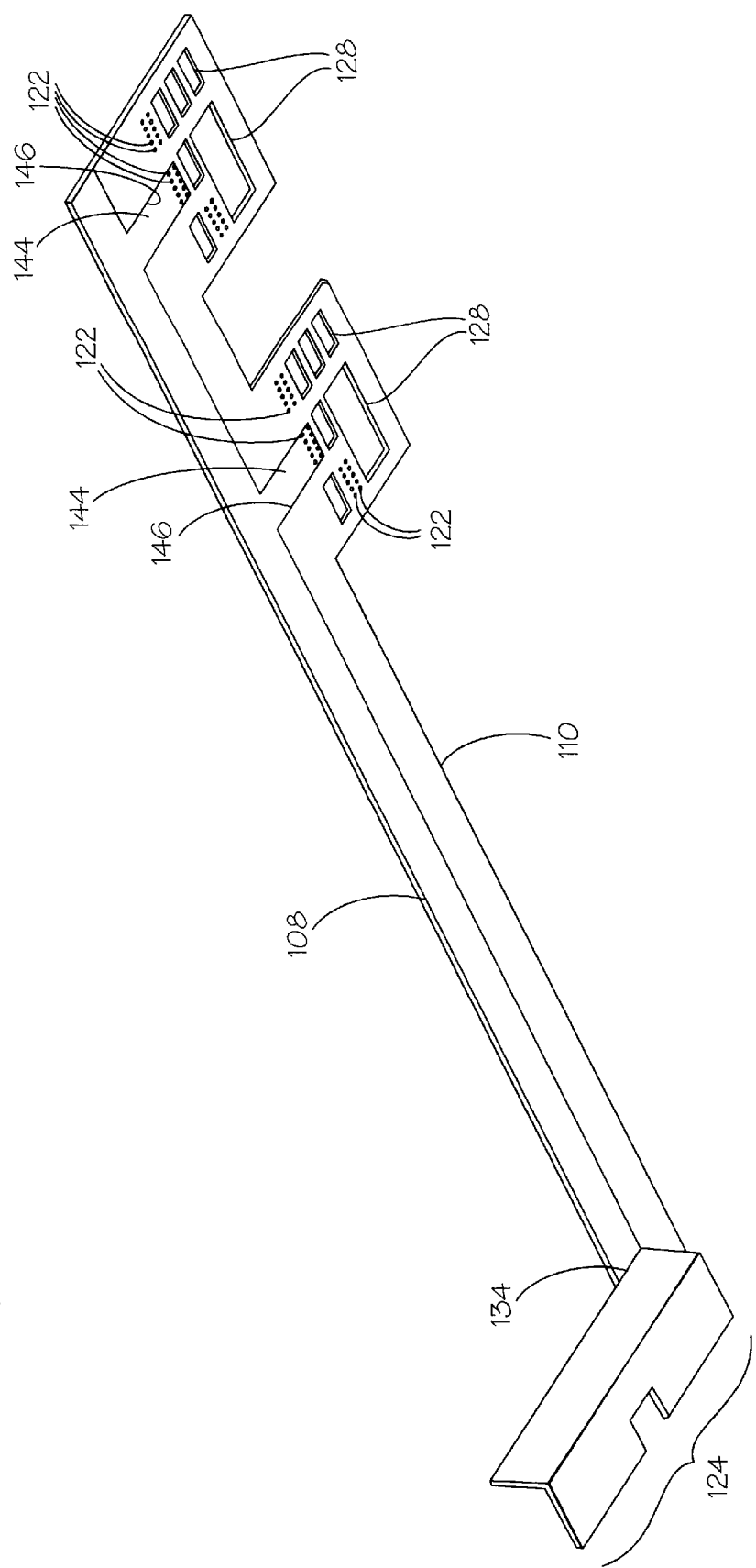
FIG. 40 is a perspective view of the fourth and fifth bus bars of FIG. 38.

As best shown in FIG. 37, a substantially planar portion or first end 151 of the fifth bus bar 110 has a plurality of recesses or openings 128 (FIG. 37 shows six holes or openings 128) and a plurality of bores 122 arranged in a plurality of patterns 121 extending transversely through the bus bar. The openings 128 provide access to the sixth bus bar 112 or accommodates the embossed regions 130 of the sixth bus bar. The plurality of bores 122 in the fifth bus bar 110 form a pattern 121 of socket contacts to receive pin contacts 140, or the like. The first end 151 is shaped and positioned such that each of the cantilever members 144 of the fourth bus bar 108 can be received in a corresponding slot 146 of the fifth bus bar 110 (see FIGS. 38 and 40). A layer 48 of insulating material electrically and physically separates the fourth bus bar 108 from the fifth bus bar 110. The second end 153 of the fifth bus bar 110 may alternatively have a bend and a single or a plurality of tabs. One tab 105 is shown in FIGS. 37 and 38. The openings 128 may alternatively comprise other suitable shapes than those shown, including but not limited to elliptical, oblong, rectangular, or hexagonal.

Figure 43:
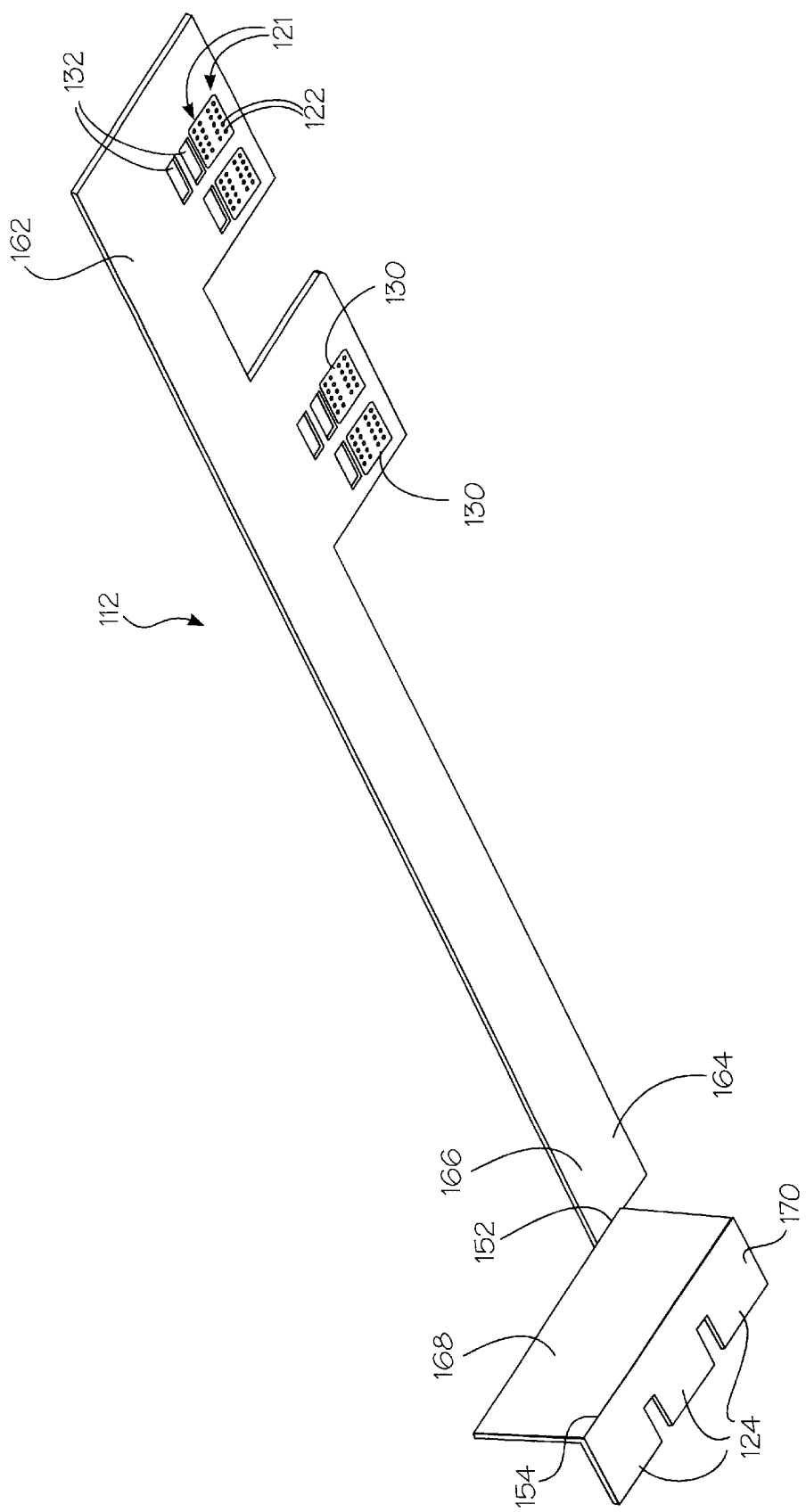
FIG. 43 is a perspective view of the sixth bus bar of FIG. 41.

FIGS. 41–43 show a sixth bus bar 112 having a substantially planar portion or first end 162 that is substantially planar and has a shape in plan substantially corresponding to the shape in plan of the combined first ends for fourth and fifth bus bars 108 and 110. The bus bar 112 has a plurality of recesses or openings 132 (FIG. 41 shows two sets of three holes or openings 132) extending transversely through first end 162 and two embossed regions 130 raised in the direction of the arrow A in FIG. 42 in the first end 162. A plurality of bores 122 (FIG. 41 shows eight groups or patterns 121 often bores 122 each) extend through the embossed regions 130 forming socket contacts to receive pin contacts 80 or 140, or the like. The second end 164 of the sixth bus bar 112 has a first and a second bend 152, 154. The first bend 152 in the sixth bus bar 112 forms two generally perpendicular sides 166, 168. The second bend 154 in the sixth bus bar 112 forms two generally perpendicular sides 168, 170. A plurality of tabs 124 (FIG. 41 shows three tabs 124) extend from the side 170 for permitting electrical connection to the bus bar 112. The openings 132 may alternatively comprise other suitable shapes than those shown, including but not limited to elliptical, oblong, rectangular, or hexagonal.

Figure 44:
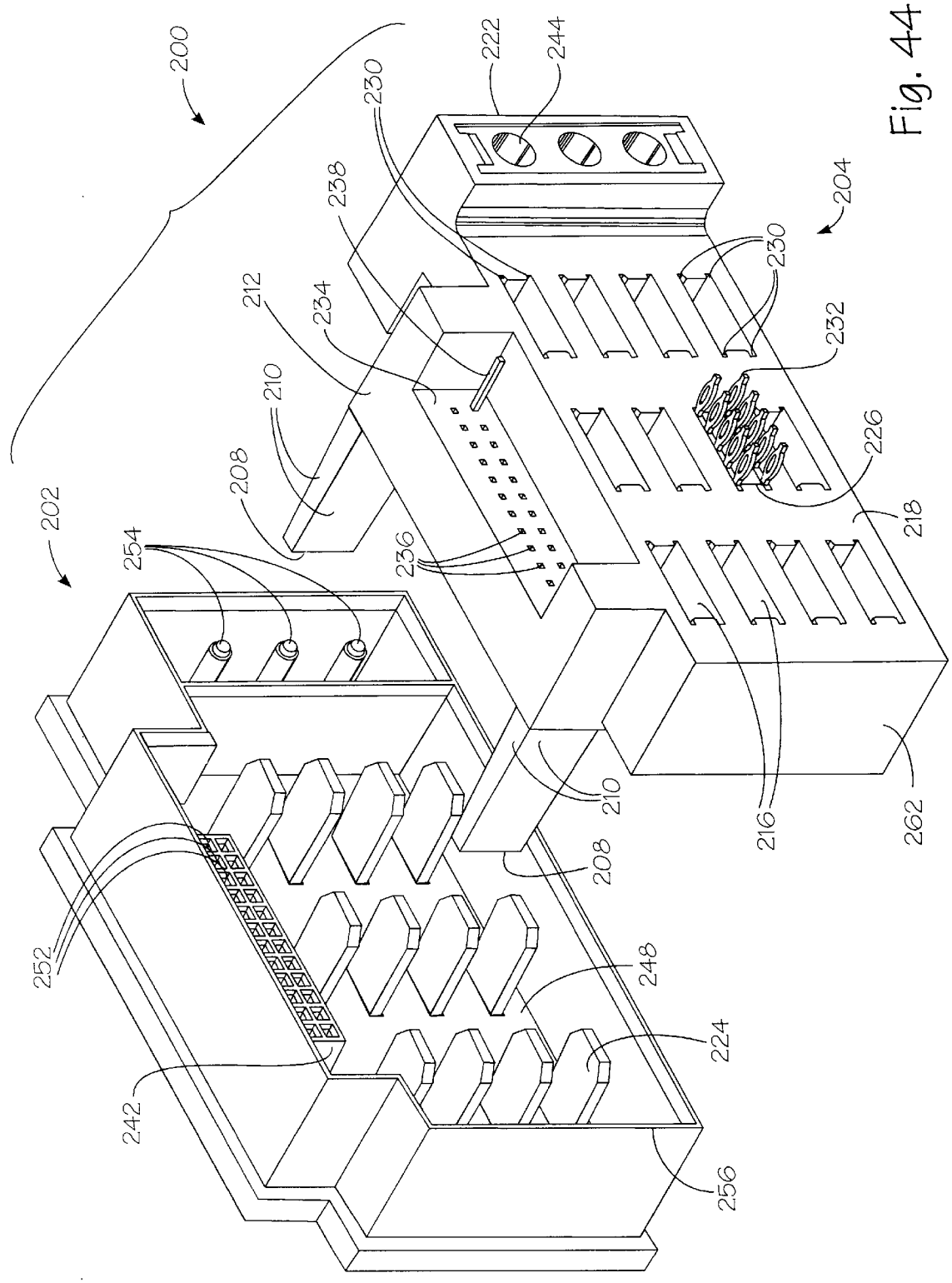
FIG. 44 is a front perspective view of a combination power and signal connector system.
Figure 45:
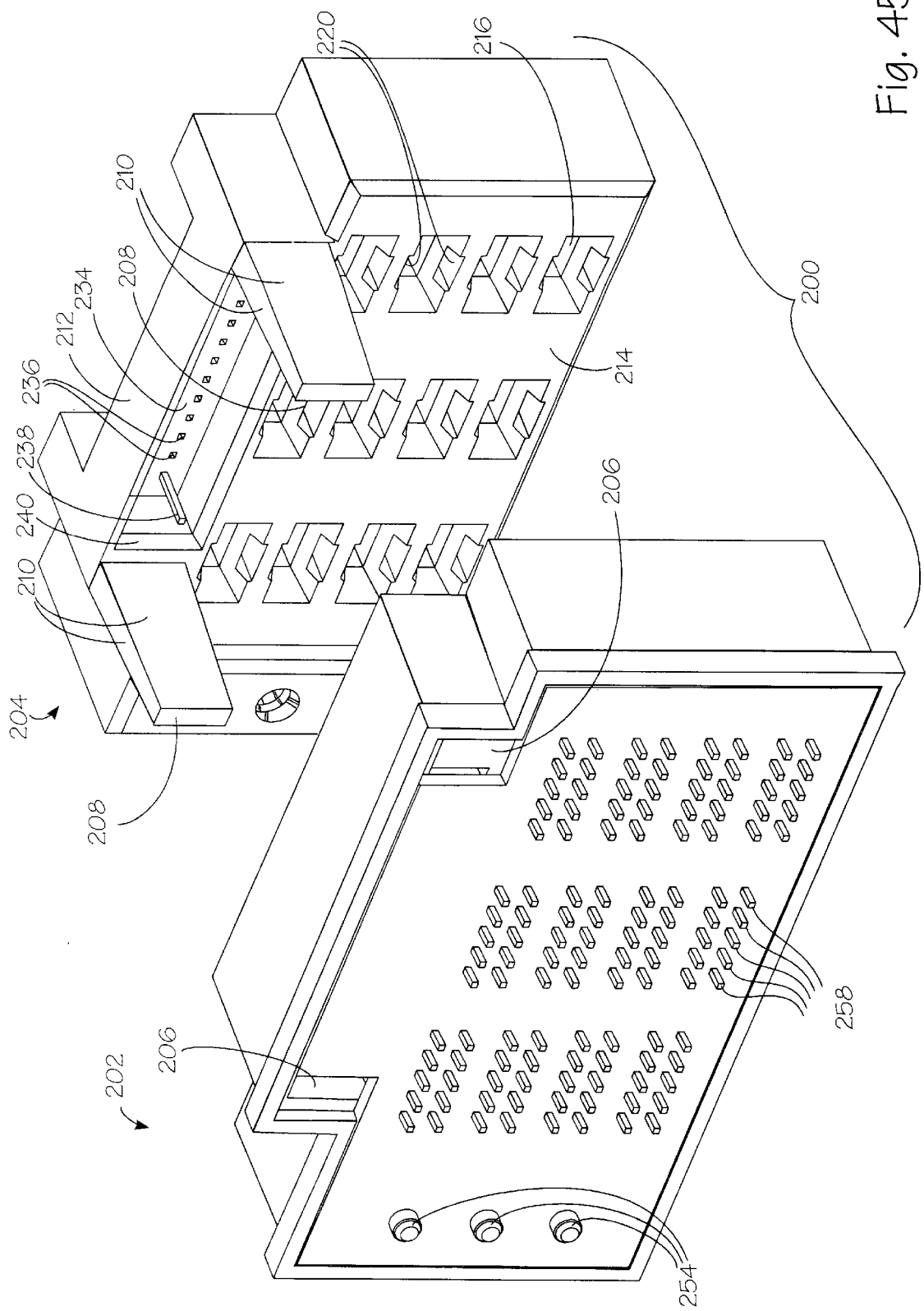
FIG. 45 is a rear perspective view of the combination power and signal connector system of FIG. 44.

As shown in FIGS. 44–45, a combination power and signal connector system 200 that includes a female connector 202 and a male connector 204 can be used with a bus bar assembly of the present invention substantially similar to bus bar assembly 30 or 100 but having four vertically-disposed groups or patterns of interconnect sockets. The connector system 200 is preferably made of an electrically insulating material, including but not limited to plastic, polyester, or resin.

Figure 46:
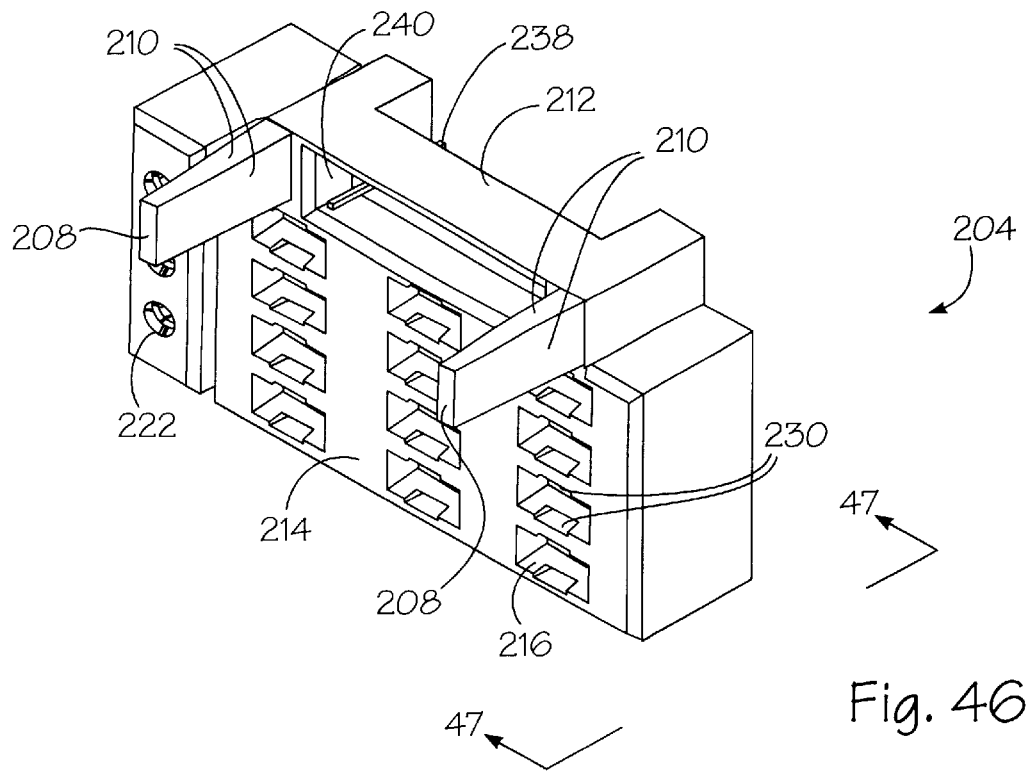
FIG. 46 is a perspective view of a male connector of the system of FIG. 44.
Figure 47:
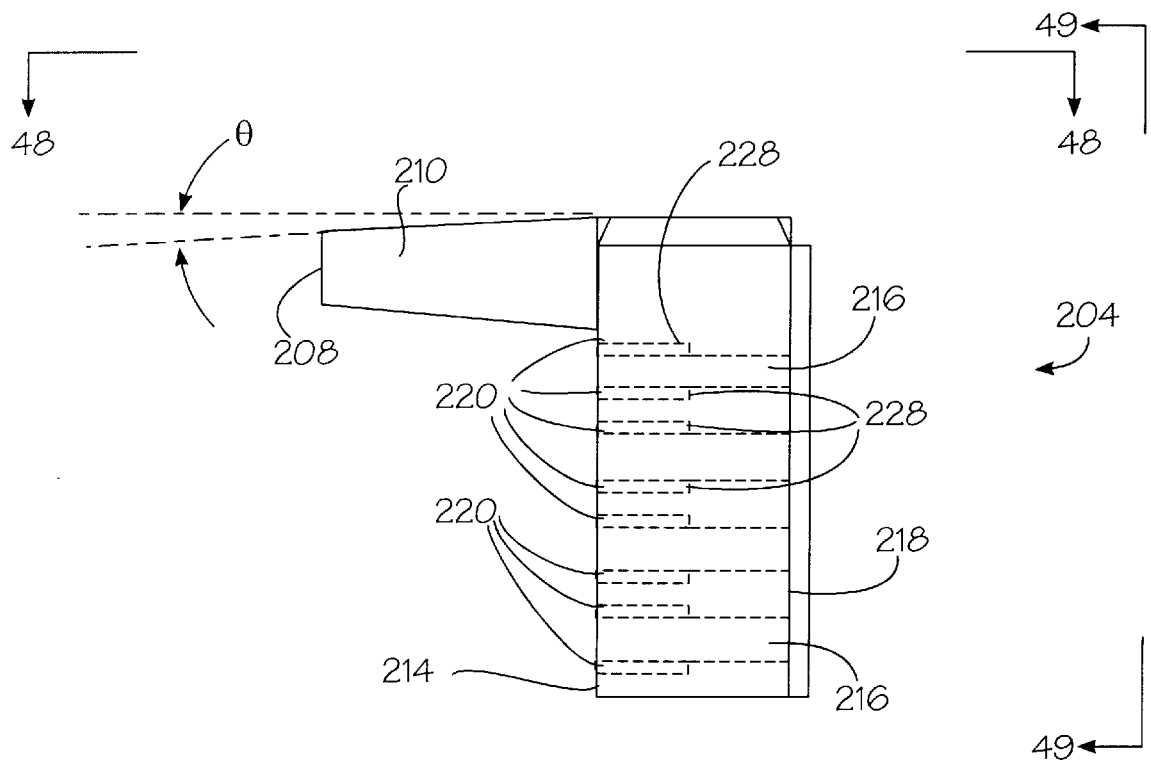
FIG. 47 is a side view of the male connector of FIG. 46 taken along the line 47—47 of FIG. 46.
Figure 48:
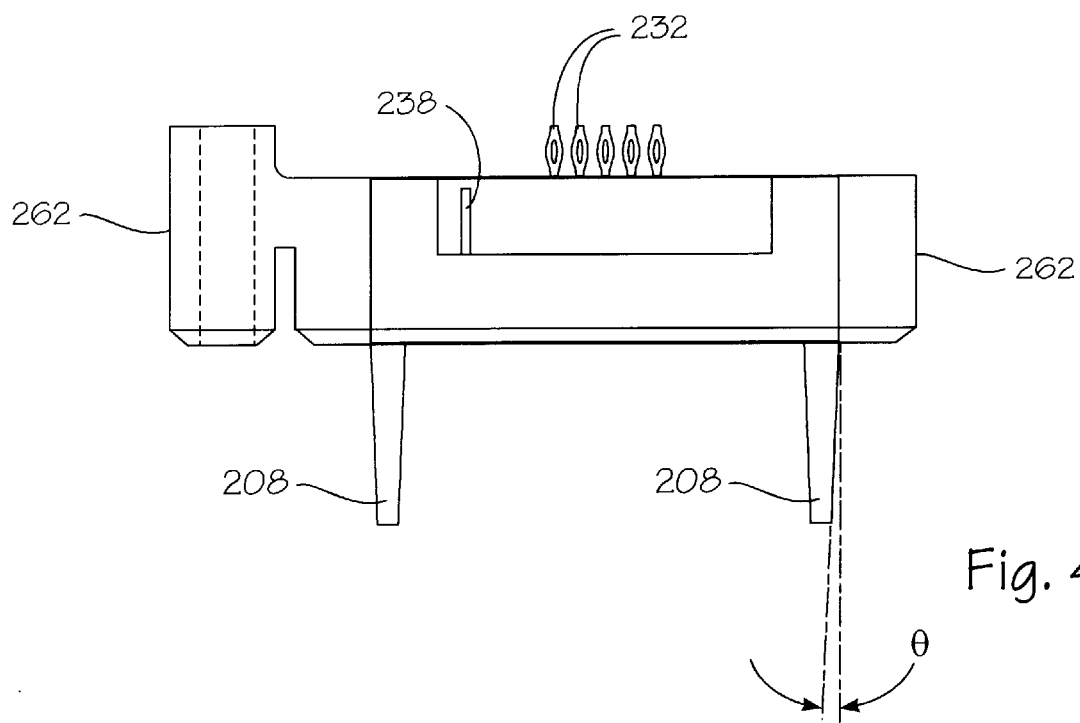
FIG. 48 is a top view of the male connector of FIG. 46 taken along the line 48—48 of FIG. 47 and rotated 90°.

To guide the mating male connector 204 toward an opening 206 in the female connector 202 and facilitate access to that opening, the male connector has a plurality of guide posts 208 (FIGS. 44–48 show two guide posts) which extend away from a front surface 214 of the male connector. The opening 206 has a cross-sectional area greater than the cross-sectional area of the guide posts 208 and receives the guide posts which extend beyond the female connector 202. The guide posts 208 have four inclined or tapered side surfaces 210 that slope inwardly from a top surface 212 to a peripheral edge of the opening 206. As best shown in FIGS. 47–48, the surfaces 210 are inclined with respect to a longitudinal axis of the connector system 200 by an angle θ which is less than 45°, measured from a line parallel to the top surface 212.

As shown in FIG. 47, the male connector 204 has a plurality of internal cavities 216 which are open to the front surface 214 and extend to a back surface 218 of the male connector 204. As best shown in FIG. 44, the internal cavity 216 is sized and configured to receive, retain, and substantially surround a plurality of electrically conductive bodies 226. For simplicity, only one of the conductive bodies 226 is shown in the drawings. Sides of the internal cavities have grooves 230 which align and support the electrically conductive bodies 226. Contact pins 232 of the electrically conductive bodies 226 extend beyond the back surface 218 of the male connector 204 for attachment to a printed circuit on a printed circuit board (not shown). The cross-sectional area of the internal cavity 216 at the front surface 214 of the male connector 204 is at least as large to also receive a male connector element 224 supported in the female connector 202. There may be any number of male connector elements 224 to provide the desired power connections to a printed circuit through the associated female and male connectors 202, 204.

At least one slot 220 is located on a side of the internal cavity 216 (FIG. 47 shows two slots) for receiving and retaining a locking protrusion (not shown) of the electrically conductive body 226. The slot is open to the front surface 214 of the male connector 204 and terminates internally in the male connector with an abutment surface 228. The slot 220 in the front surface 214 provides access for a latch release tool (not shown) in the event that the locking protrusion (not shown) must be dislodged from the abutment surface 228 so that the electrically conductive bodies 226 may be separated from the male connector 204.

FIGS. 44–46 show a female signal connector module 234 which defines a plurality of socket contacts 236 to receive electrically conductive signal pins 238. For simplicity, only one of the pins 238 is shown in FIGS. 44–47. The female signal connector module 234 has a lead-in or chamfered edge 240 which guides a mating male signal connector module 242 into the signal connector module. The female signal connector module 234 can have a keyway or some particular geometric shape to help ensure a proper connecting orientation of the mating male signal connector 242 such that the signal pins 238 extend through both the male and female signal connector modules 234, 242. There may be any number of signal pins 238 to provide desired signals to a printed circuit through the associated female and male connectors 202, 204.

Figure 49:
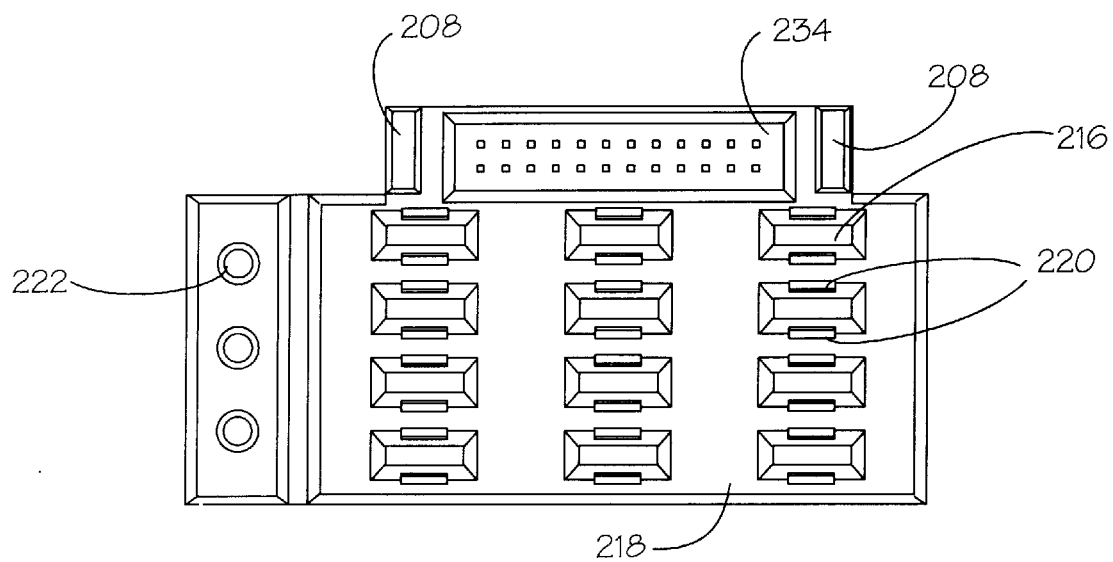
FIG. 49 is a front view of the male connector of FIG. 46 taken along the line 49—49 of FIG. 47.

The male connector 204 has a plurality of sockets 222 (FIGS. 44 and 49 show three sockets arranged vertically) which open generally parallel to the plane of the front surface 214. An internal surface of the socket 222 may be provided with a resilient spring-contact element 244 composed of an electrically conductive material, including but not limited to copper, silver, or gold. The sockets 222 are electrically isolated from the internal cavities 216.

Figure 52:
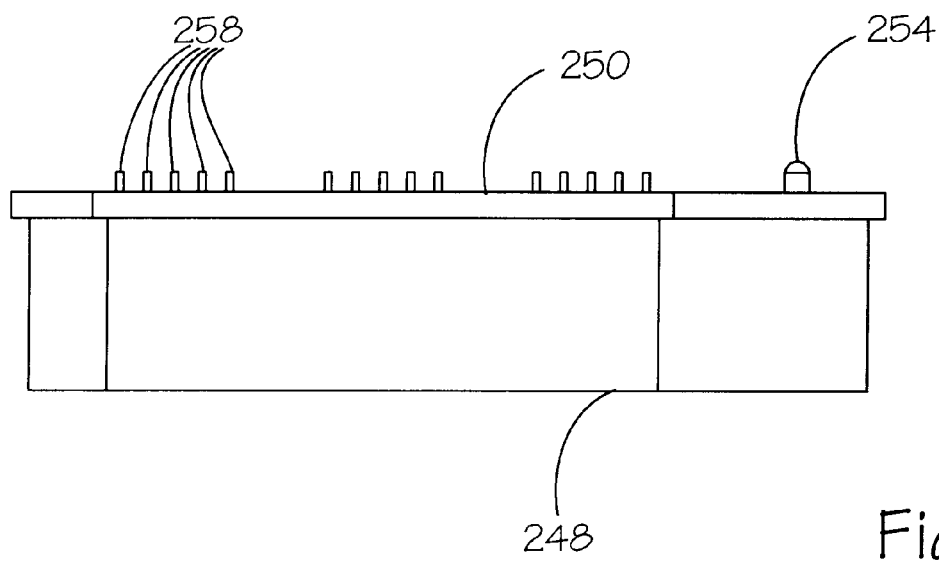
FIG. 52 is a top view of the female connector of FIG. 50 taken along the line 52—52 of FIG. 51.

The female connector 202 of the combination power and signal connection system 200 has a plurality of openings 246 which open to a front. surface 248 and extend to a back surface 250. The openings 246 are sized and configured to receive, retain, and surround a plurality of electrically conductive male connector elements 224. As shown in FIGS. 45 and 52, the pin contacts 258 of the male connector elements 224 extend beyond the back surface 250 and are received into the bores 54 of a bus bar assembly of the present invention such as either of bus bar assemblies 30 or 100.

Figure 50:
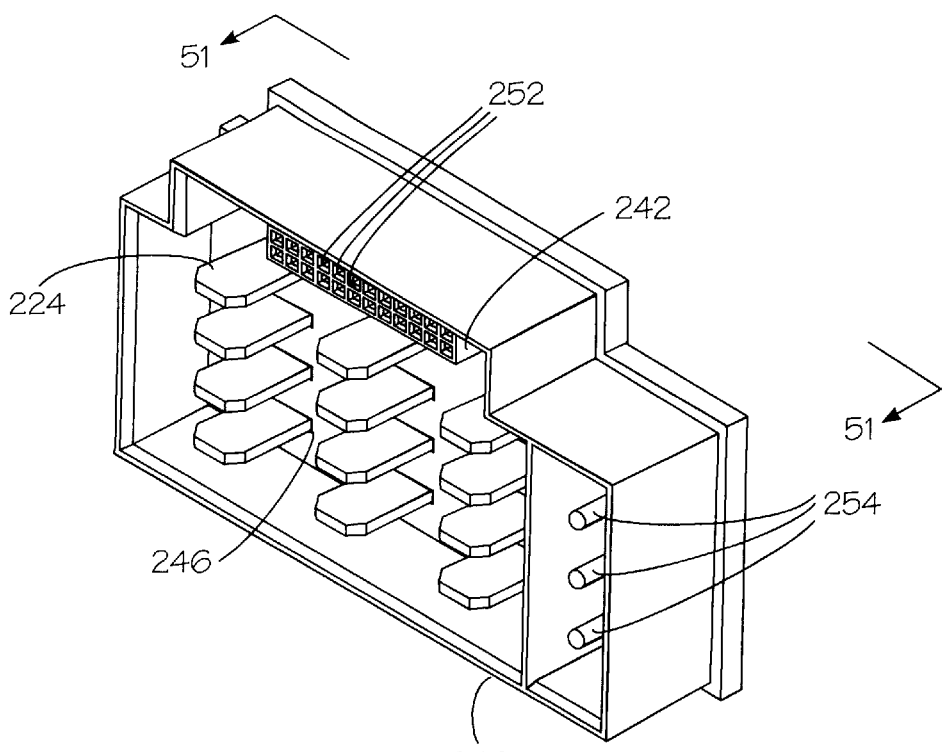
FIG. 50 is a perspective view of a female connector of the system of FIG. 44.
Figure 51:
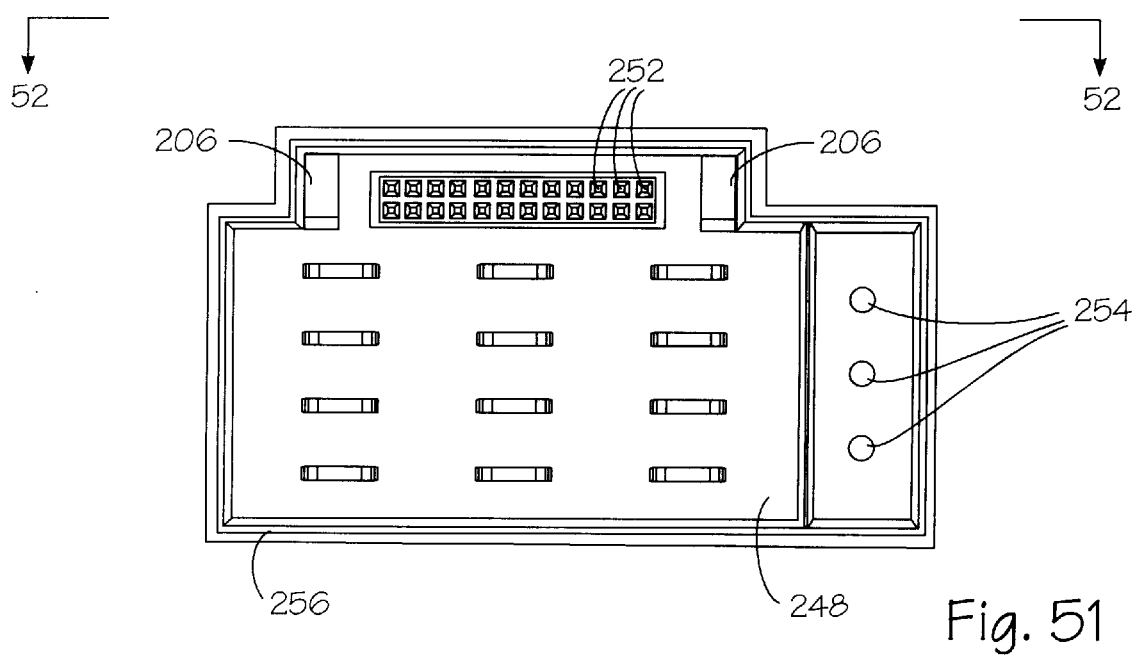
FIG. 51 is a front view of the female connector of FIG. 50 taken along the line 51—51 of FIG. 50.

FIGS. 44 and 50–51 show a male signal connector module 242 of the female connector 202 which defines a plurality of socket contacts 252 which support and pluggably mate with the signal pins 238 of the male connector 204. A plurality of electrically conductive contact terminals or cylindrical pins 254 (FIGS. 50–51 show three contact terminals) extend from the front surface 248 of the female connector 202 and are formed for insertion into the cooperatively-mating sockets 222 of the male connector 204. A wall 256 extends from the front surface 250 of the female connector 202 a distance not less than the depth of the male connector 204. When the female and male connectors 202, 204 engage, the wall 256 surrounds the outer side surface 262 of the male connector 204.

Figure 53:
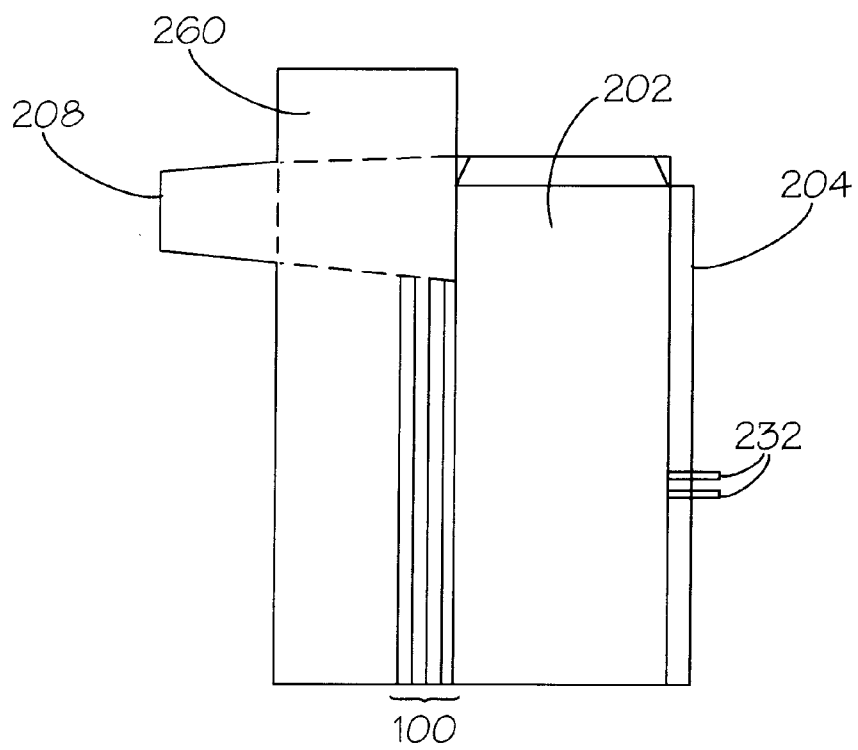
FIG. 53 is a side view of the combination power and signal connector system engaging a bus bar assembly of FIG. 25.

FIG. 53 shows the female and male connectors 202, 204 engaging bus bar assembly 100. The guide posts 208 extend over the bus bar assembly 100 and are received in a connector system mounting plate 260. An attachment means, including but not limited to screws, rivets or clamps, secures the bus bar assembly 100 to the combination power and signal connector system 200. In another embodiment, the female and male connectors 202, 204 engage the bus bar assembly of the present invention, such as bus bar assemblies 30 or 100, having openings to receive the guide posts 208. The bus bar assemblies of the present invention are preferably insulated electrically from their surrounding by any suitable means known to those skill in the art such as by encapsulating the bus bar assemblies in an insulating plastic or other material.

The present invention advantageously provides a multi-layered bus bar assembly, that can be comprised of a plurality of substantially planar bus bars, having common access layers. In that regard, one or more sockets or bores from a plurality of the bus bars forming the assembly are disposed substantially in a plane of the assembly. Thus, the contact pins or tails for engaging each of those sockets can be substantially of the same size and a different sized contact pin for each of the bus bars of the assembly is not needed. This commonality of pin size results in reductions in cost of the contact pins and related components forming part of the electrical assembly. In the bus bar assemblies shown herein, the user may utilize one or as shown two different length plug pins to access the six bus bars of the assembly. Further, a plurality of openings are provided in some of the bus bars of the assembly to accommodate embossed regions in adjacent bus bars such that a bus bar assembly comprised of six layers has a thickness of four layers.

The bus bar assemblies of the present invention advantageously permit a solderless connection to the bus bars of the assembly. More specifically, the bus bar assemblies allow for a press-fit electrical connection and preferably a compliant press-fit electrical connection between one or more pin-type electrical connectors and the bus bars of the assembly. The solderless connection does not require any screws, bolts or additional mounting hardware.

It should be appreciated that the invention hereof is broad enough to cover a single socket-type interconnect hole, such as any one of holes 54 or 122, in a single bus bar which permits a press-fit electrical connection to be made with the bus bar by inserting any suitable pin-type electrical connector such as contact pins 80 or 258 into the interconnect hole of the bus bar.

In accordance with another aspect of the present invention, a method of creating and insulating the openings in a bus bar assembly includes the steps of: creating an opening through a first bus bar, applying an insulating material along the surface of the first bus bar, creating an opening through the insulating material having a smaller cross-sectional area than the opening through the first bus bar, placing a second bus bar with an embossed region adjacent to openings in the first bus bar and the insulating material, and pressing the embossed region through the openings such that insulating material contacts the walls of the opening of the first bus bar.

As can be seen from the foregoing, a bus bar that does not require a soldered connection for electrically connecting to the bus bar has been provided. In one embodiment where a multilayer bus bar assembly is provided, pin contacts of equal length can be used to electrically connect to the bus bar assembly so as to reduce the number of differing sized pin contacts required for use with the assembly.

While the invention has been described in detail with reference to several embodiments thereof, it will be apparent to one skilled in the art that various changes and modifications can be made and equivalents employed, without departing from the present invention.

What is claimed is:

1. A bus bar assembly for use with a plurality of pin members having respective lengths comprising first and second bus bars having substantially planar portions disposed in juxtaposition, means disposed between bus bars from each of the first and second bus bars being made from an electrically conductive material and having a region provided with at least one interconnect hole extending through the bus bar and adapted to cooperatively receive one of the pin members, the regions of the first and second bus bars being disposed substantially in a plane so as to permit pin members of substantially equal lengths to be utilized for making electrical connections with the bus bars.

2. The bus bar assembly of claim 1 wherein said means includes a layer of insulating material disposed between the first and second bus bars.

3. The bus bar assembly of claim 1 wherein the portions of the first and extend substantially in respective planes, the region of the first bus bar being disposed in the plane of the second bus bar.

4. The bus bar assembly of claim 3 wherein the second bus bar is provided with a recess for receiving the region of the first bus bar.

5. The bus bar assembly of claim 2 further comprising third and fourth bus bars having portions extending substantially in respective planes, the region of the third bus bar being disposed in the plane of the fourth bus bar.

6. The bus bar assembly of claim 3 further comprising a third bus bar having a portion extending substantially in a plane, the region of the third bus bar being disposed in the plane of the second bus bar.

7. The bus bar assembly of claim 6 wherein the second bus bar is disposed between the first and third bus bars.

8. The bus bar assembly of claim 1 wherein the at least one interconnect hole in the region of each of the first and second bus bars includes a plurality of interconnect holes arranged in a pattern.

9. The bus bar assembly of claim 8 wherein the pattern of interconnect holes includes first and second rows of interconnect holes.

10. The bus bar assembly of claim 9 wherein the first and second rows each consist of five interconnect holes.

11. A bus bar assembly for use with first and second pin members comprising first and second bus bars of an electrically conductive material having respective first and second end portions, an insulator disposed between the first and second bus bars for electrically isolating the bus bars from each other, the first end portion of each of the first and second bus bars being provided with at least one interconnect socket extending through the bus bar adapted to cooperatively receive and electrically couple to the respective pin member, the second end portions of the first and second bus bars having at least first and second spaced-apart tabs aligned substantially in a plane extending perpendicular to the bus bars for permitting electrical connections with the bus.

12. The bus bar assembly of claim 11 wherein the second end portions of the first and second bus bars have third and fourth spaced-apart tabs aligned substantially in an additional plane extending perpendicular to the bus bars and spaced apart from the first-named plane.

13. The bus bar assembly of claim 11 wherein the second end portions extend at a right angle to the first end portions.

14. The bus bar assembly of claim 11 wherein the at least one interconnect hole includes first and second rows of interconnect holes, each of the first and second rows consisting of five interconnect holes.

15. A bus bar assembly for use with a pin contact comprising first and second conductive bus bars arranged in juxtaposition and separated by an insulating layer, the first bus bar having at least one embossed region provided with an interconnect socket extending through the region adapted for receiving and forming an electrical connection with the pin contact, the second bus bar having a portion provided with at least one opening for receiving the embossed region of the first bus bar so that such embossed region is substantially coplanar with the portion of the second bus bar.

16. The bus bar assembly of claim 15 further comprising a third conductive bus bar having at least one embossed region provided with an interconnect socket for receiving and forming an electrical connection with another pin contact, the portion of the second bus bar being provided with an additional opening for receiving the embossed region of the third bus bar.

17. The bus bar assembly of claim 15 wherein the embossed region includes a plurality of interconnect sockets for receiving a respective plurality of pin contacts.

18. The bus bar assembly of claim 17 wherein the plurality of interconnect sockets are arranged in a pattern of first and second rows with five interconnect sockets in each row.

* * * * *